(12) United States Patent
Dubey et al.

(10) Patent No.: US 10,976,498 B2
(45) Date of Patent: Apr. 13, 2021

(54) TRAY AND CLIP STRUCTURE FOR OPTOMECHANICAL COMPONENTS

(71) Applicant: Cisco Technology, Inc., San Jose, CA (US)

(72) Inventors: Neeraj Kumar Dubey, Sunnyvale, CA (US); Adam Jacob Forrer, Reading, PA (US); Steven Luther Moyer, Lancaster, PA (US); Prakash Gothoskar, Allentown, PA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/695,486

(22) Filed: Nov. 26, 2019

(65) Prior Publication Data

US 2020/0393624 A1 Dec. 17, 2020

Related U.S. Application Data

(60) Provisional application No. 62/861,346, filed on Jun. 14, 2019.

(51) Int. Cl.
*G02B 6/36* (2006.01)
(52) U.S. Cl.
CPC .................... *G02B 6/362* (2013.01)
(58) Field of Classification Search
CPC .... G02B 6/362; G02B 6/3624; G02B 6/3628; G02B 6/3632; G02B 6/3636; G02B 6/364; G02B 6/3644

(Continued)

(56) References Cited

U.S. PATENT DOCUMENTS 5,293,435 A * 3/1994 Takahashi ............ G02B 6/2804
385/47
5,360,109 A * 11/1994 Janota ...................... B65D 1/36
206/564

(Continued)

FOREIGN PATENT DOCUMENTS

FR 2578006 * 2/1985 ................ F16B 2/20
WO 8800161 A1 1/1988
WO 1996038752 A1 12/1996

OTHER PUBLICATIONS

International Search Report and Written Opinion in counterpart International Application No. PCT/US2020/036562, dated Oct. 23, 2020, 21 pages.

(Continued)

*Primary Examiner* — Robert Tavlykaev
(74) *Attorney, Agent, or Firm* — Edell, Shapiro & Finnan, LLC

(57) ABSTRACT

Presented herein is a tray for shipping, handling, and/or processing optomechanical components. The tray has a plurality of pockets arranged in an array, wherein each pocket is configured to hold one optomechanical component, and wherein each pocket includes at least one fiducial hole, at least one vacuum hole, a first cradle element configured to support a clip that attaches to one or more optical fibers of the optomechanical component, and a second cradle element configured to support a head of the optomechanical component. Also presented herein is a clip for an optomechanical component that includes a body having a top face and a bottom face, and a plurality of gripping elements arranged in pairs on the bottom face, each pair of gripping elements configured to support a barrel of an optical connector attached to a corresponding optical fiber of the pair of optical fibers.

20 Claims, 27 Drawing Sheets

(58) Field of Classification Search
USPC .................................. 385/134, 136, 137
See application file for complete search history.

(56) References Cited

U.S. PATENT DOCUMENTS

| | | | | |
|---|---|---|---|---|
| 5,781,685 | A | * | 7/1998 | Simchock .............. G02B 6/362 385/134 |
| 5,794,783 | A | | 8/1998 | Carter |
| 5,871,559 | A | * | 2/1999 | Bloom ................. G02B 6/2551 414/8 |
| 6,003,341 | A | * | 12/1999 | Bloom ................. G02B 6/2551 65/484 |
| 6,574,412 | B2 | * | 6/2003 | Brun ...................... G02B 6/362 385/114 |
| 6,728,459 | B2 | * | 4/2004 | Afflerbaugh ........... G02B 6/362 385/135 |
| 7,129,722 | B1 | * | 10/2006 | Brophy ................ G01R 31/304 324/750.25 |
| 9,568,682 | B1 | * | 2/2017 | Barwicz ............... G02B 6/3652 |
| 9,864,146 | B1 | | 1/2018 | Fu et al. |
| 2003/0002847 | A1 | * | 1/2003 | Shekel ................... G02B 6/362 385/147 |
| 2005/0238312 | A1 | * | 10/2005 | Meder ................. C03C 25/1061 385/137 |
| 2013/0118124 | A1 | | 5/2013 | Cheah et al. |
| 2017/0363831 | A1 | | 12/2017 | Cornelissen et al. |
| 2019/0002191 | A1 | | 1/2019 | Abebaw |
| 2020/0307116 | A1 | * | 10/2020 | Wilkinson .......... B29C 65/7808 |

OTHER PUBLICATIONS

International Search Report and Written Opinion in counterpart International Application No. PCT/US2020/036562, dated Sep. 2, 2020, 17 pages.

* cited by examiner

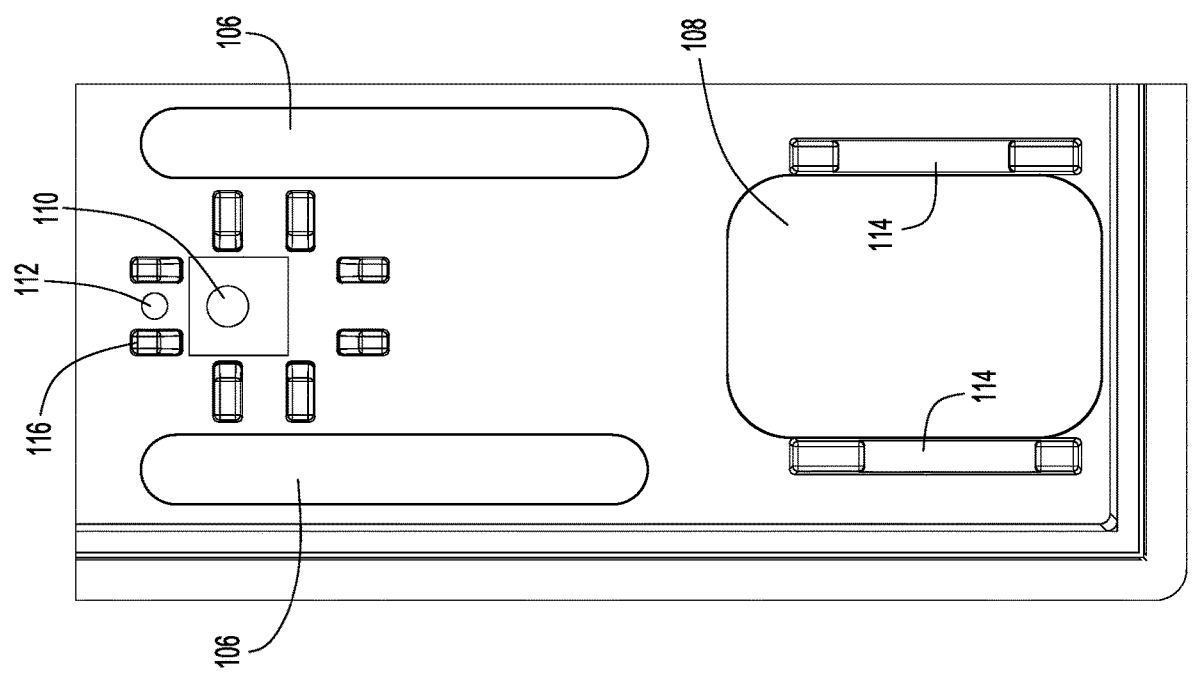

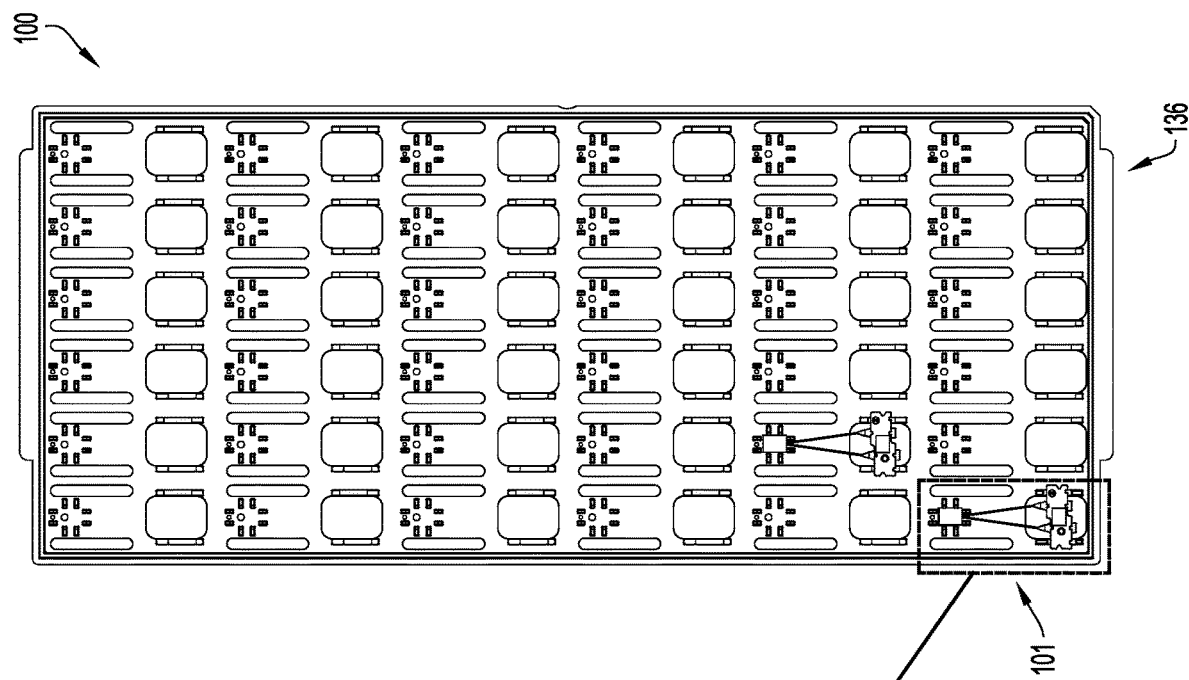
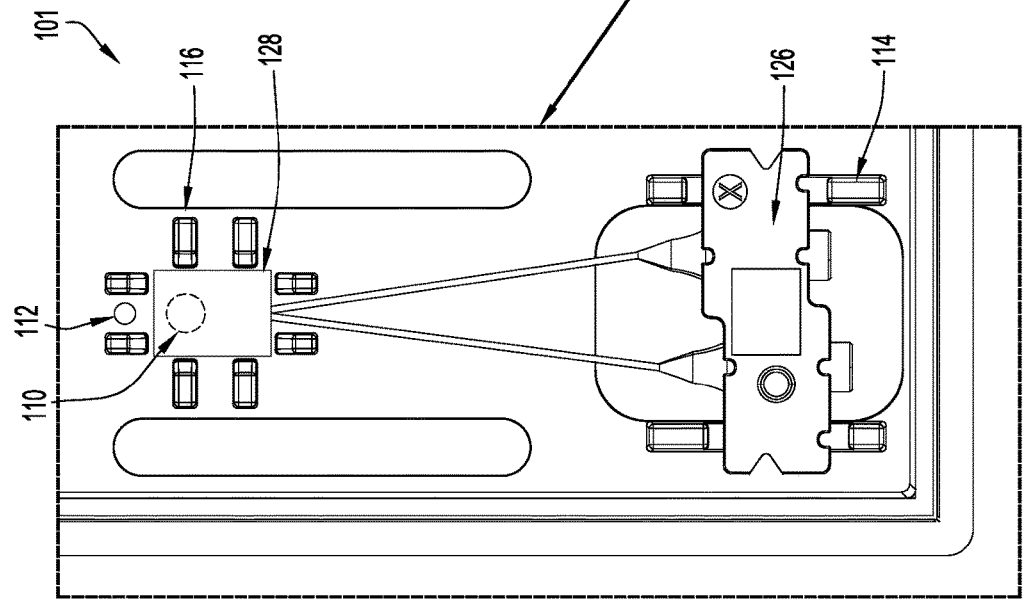
FIG.13B

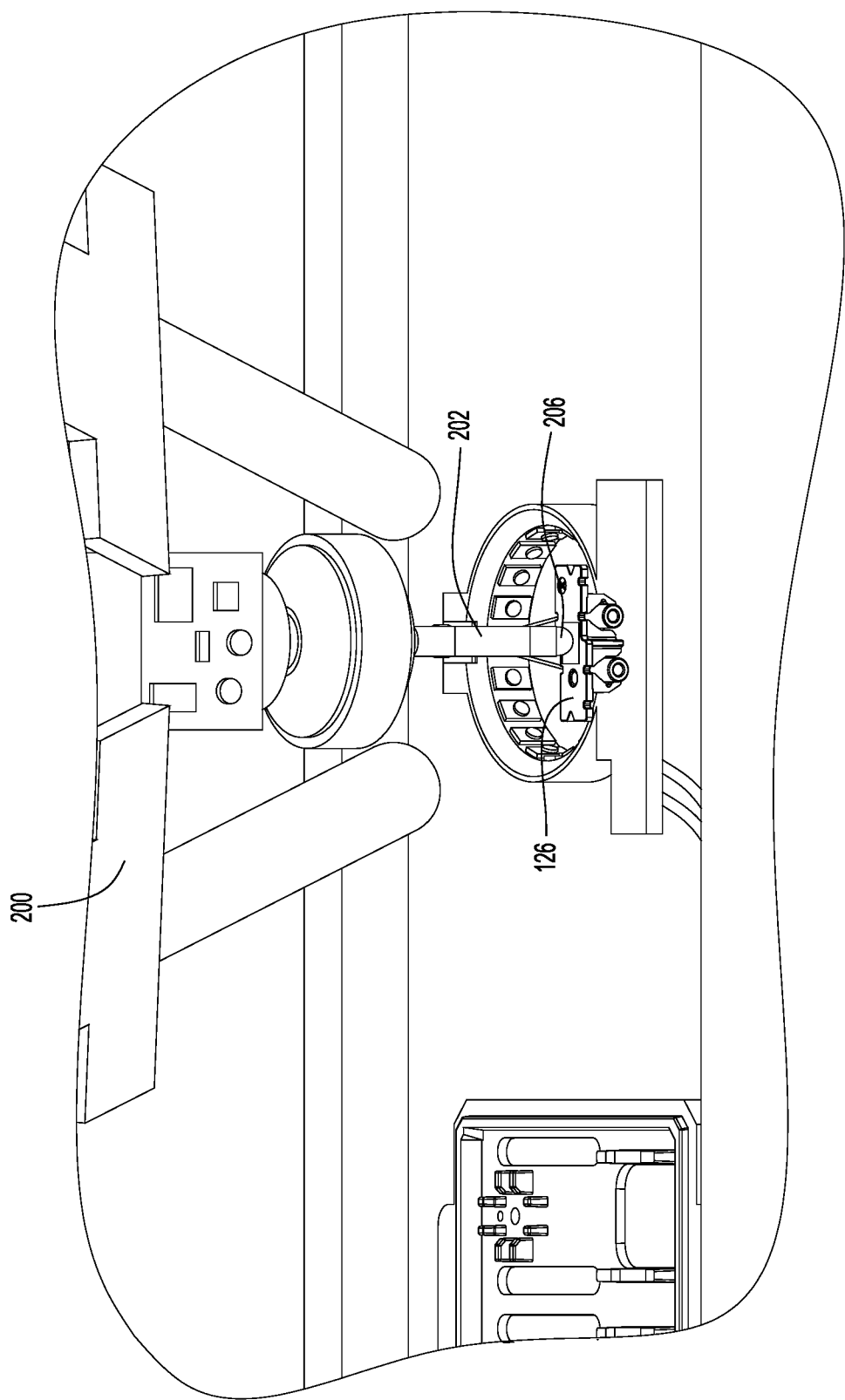

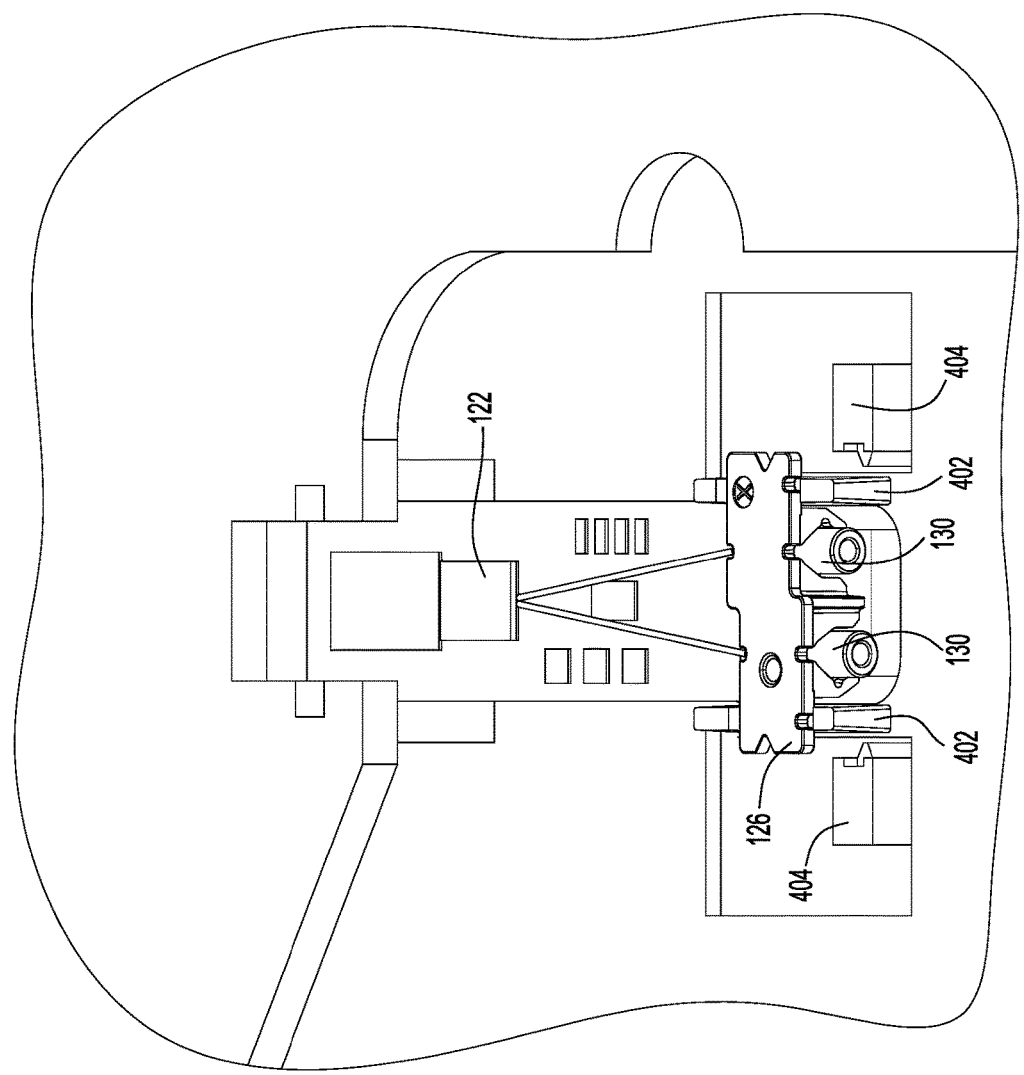

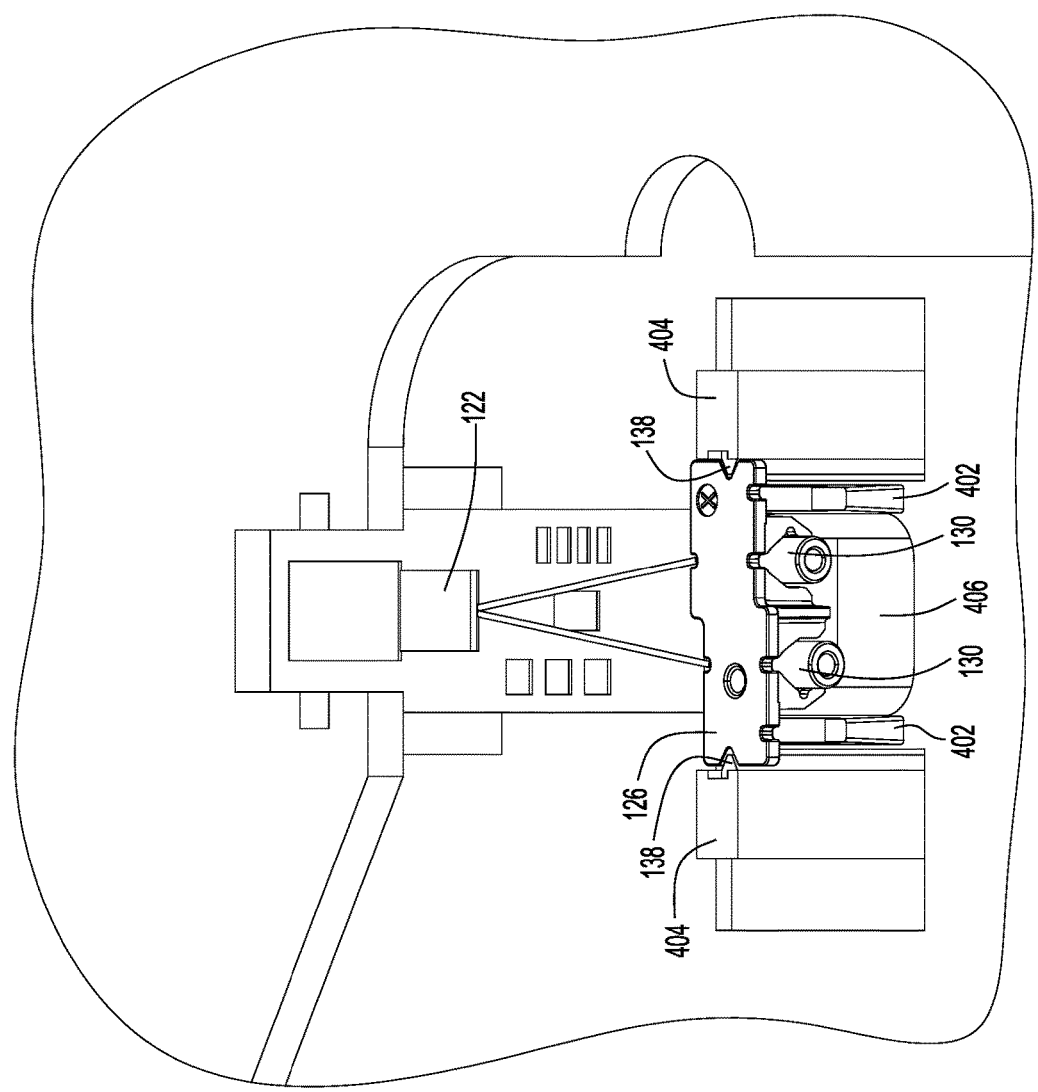

US 10,976,498 B2

TRAY AND CLIP STRUCTURE FOR OPTOMECHANICAL COMPONENTS

PRIORITY CLAIM

This application claims priority to U.S. Provisional Application No. 62/861,346, filed Jun. 14, 2019. The entirety of this application is incorporated herein by reference.

TECHNICAL FIELD

The present disclosure relates to trays for optomechanical components.

BACKGROUND

The shipping and handling of optomechanical components, such as optical fiber arrays, may be a challenge due to the sensitivity of the components and the nature of cleanroom environments. In a high-volume manufacturing scenario, properly processing optomechanical components can result in decreased productivity (e.g., in terms of units processed per hour and/or cycle time per unit), more hours of personnel time, increased material utilization and wastage, and an increase in the level of accountability required when traversing through multiple assembly locations. Thus, processing optomechanical components properly can be a costly endeavor.

BRIEF DESCRIPTION OF THE DRAWINGS

FIG. 13A is a diagram depicting a top view of the pocket for an optomechanical component, in accordance with an example embodiment.

FIG. 13B is a diagram depicting a top view of the pocket that is supporting an optomechanical component, with reference to a tray, in accordance with an example embodiment.

FIGS. 15A and 15B are diagrams depicting a vacuum tip tool of a bonding machine engaging an optomechanical component assembly, in accordance with an example embodiment.

FIG. 17A is a diagram depicting an optomechanical component assembly prior to being constrained, in accordance with an example embodiment.

FIG. 17B is a diagram depicting an optomechanical component assembly that is constrained, in accordance with an example embodiment.

DESCRIPTION OF EXAMPLE EMBODIMENTS

Overview

Figure 1:
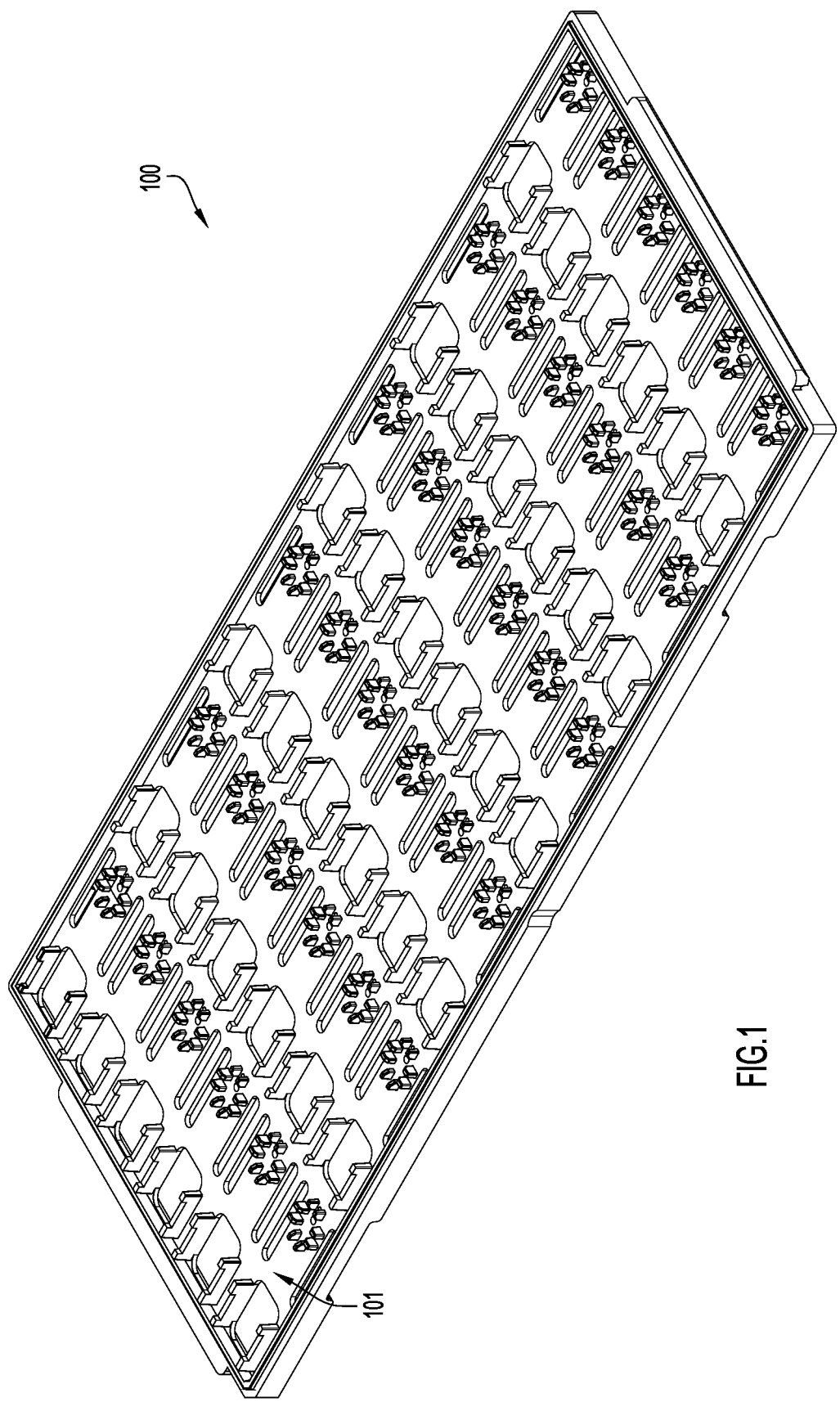
FIG. 1 is a diagram depicting an isometric view of a tray for optomechanical components, in accordance with an example embodiment.

In one embodiment, a tray is provided for shipping, handling, and/or processing optomechanical components. The design of the tray provides for the safe delivery of components, and ensures that the tray may be compatible with existing automation tools as a process piece part, thereby reducing human involvement during the assembly process. Present embodiments provide significant cost-savings along with the additional benefits of reduced per-unit cycle times and increased unit-per-hour processing rates.

A tray for shipping, handling, and/or processing optomechanical components may include a plurality of pockets arranged in an array, wherein each pocket is configured to hold one optomechanical component, and wherein each pocket includes at least one fiducial, at least one vacuum hole, a first cradle element configured to support a clip that attaches to one or more optical fibers of the optomechanical component, and a second cradle element configured to support a head of the optomechanical component.

EXAMPLE EMBODIMENTS

The present disclosure relates to trays for optomechanical components. In the field of electronics manufacturing, standard dimensions for components may be defined by organizations or standardization bodies, such as the Joint Electron Device Engineering Council (JEDEC) Solid State Technology Association. Certain devices, such as ball grid array packages, ceramic packages, and processed silicon chips, may require trays whose geometries satisfy particular standards in order to house the devices during shipping or handling. Embodiments presented herein provide a tray suitable for housing unwieldly and delicate optomechanical components, such as optical fiber array units. Optical fiber array units may have connectorized optical fibers that are either individually separated or in ribbon form. The optical fibers may be connectorized with optical connectors such as Lucent Connector (LC) ports (also known as Little Connector or Local Connector ports).

Each pocket may be designed to hold a component in a desired orientation that enables components to be safely transported. Moreover, components may be positioned in pockets in a manner that facilitates the assembly process in a factory or cleanroom. For example, bonder machines may require piece parts to be positioned within a certain tolerance limit in order to be accurately gripped and picked up either mechanically or by vacuum. The tolerances of each pocket's features should therefore match the requirements of the appropriate equipment set. The presence of loose LC ports in two-channel fiber arrays may present additional problems that are addressed by embodiments presented herein.

By employing trays to ship and handle fiber arrays, costs may be significantly reduced, as fiber arrays are conventionally shipped in individual plastic pouches on a thermoformed plastic tray. Thus, present embodiments reduce the amount of materials that are wasted during the processing of fiber arrays. Each tray may be filled with fiber arrays, and stacks of four to five trays can be contained in vacuum-sealed bags. Using present embodiments, a fiber array bonder can be loaded with an entire tray of fiber arrays, greatly decreasing the per-unit processing time by avoiding the need to unpack fiber arrays individually. Thus, embodiments presented herein can enable automation in high-volume manufacturing scenarios, thereby achieving net increased weekly output by over 63%.

Embodiments are now described in detail with reference to the figures. Depicted measurements are in units of millimeters; in some embodiments, the measurements may vary from the depicted values. In some embodiments, the depicted measurements vary within acceptable tolerance ranges.

FIG. 1 is a diagram depicting an isometric view of a tray 100 for optomechanical components, in accordance with an example embodiment. A tray includes a plurality of pockets 101 forming an M×N or M×M matrix that may each house an optomechanical components. The size of the matrix of pockets 101 may be determined according to the dimension of the piece part being housed in the tray. For example, the tray 100 depicted in FIG. 1 features a six-by-six matrix of pockets 101; alternative embodiments may feature various other matrix sizes. In some embodiments, the dimensions of a tray conform to a standard outlined in JEDEC Solid State Technology Association Publication Number 95 Design Guide 4.10, and a tray 100 may meet a maximum temperature rating outlined in Publication 95 Design Guide 4.10. Trays 100 may be stackable in quantities of three to eight units. The material of a tray 100 may be a carbon-filled glass composite or equivalent, and may have a static dissipative surface resistivity of $10^5$ to $10^{12}$ ohms/square.

Figure 2:
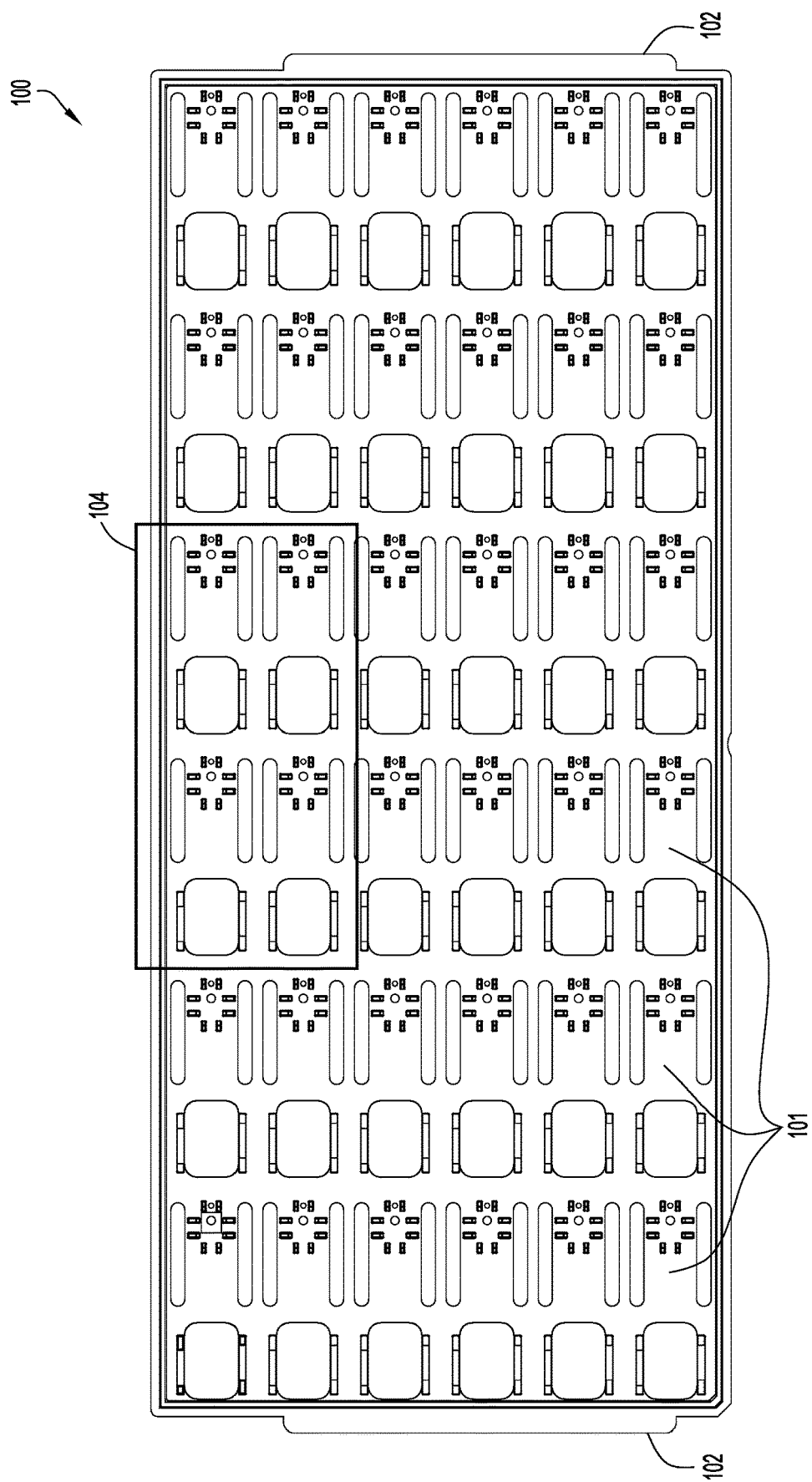
FIG. 2 is a diagram depicting a top view of a tray for optomechanical components, in accordance with an example embodiment.

FIG. 2 is a diagram depicting a top view of a tray 100 for optomechanical components, in accordance with an example embodiment. As depicted, the tray 100 includes a plurality of pockets 101, handles 102 to facilitate pick-up of the tray by humans, equipment, etc. Portion 104 of the tray is depicted and described in further detail with respect to FIGS. 5-7.

Figure 3:
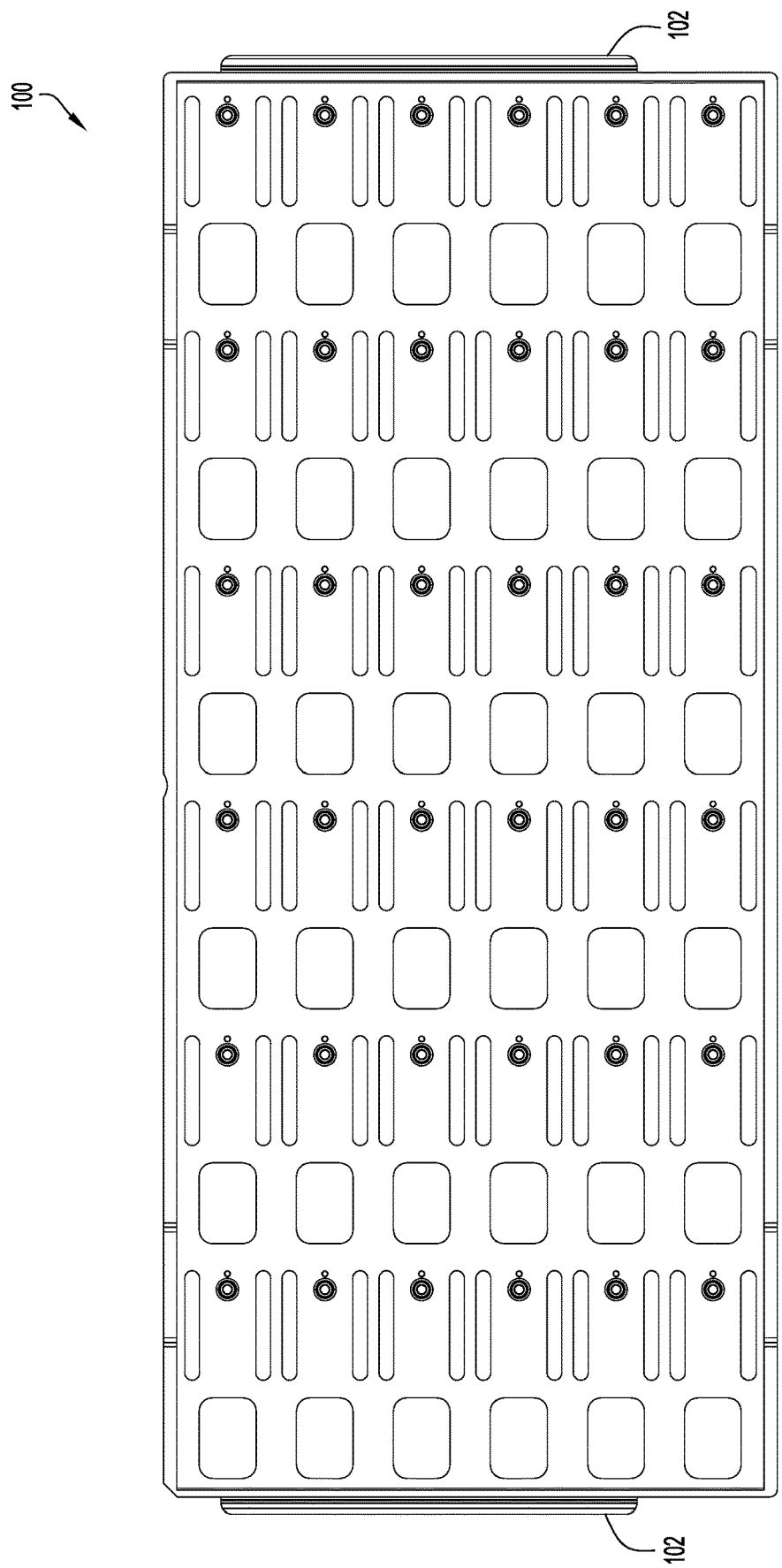
FIG. 3 is a diagram depicting a bottom view of a tray for optomechanical components, in accordance with an example embodiment.

FIG. 3 is a diagram depicting a bottom view of a tray 100 for optomechanical components, in accordance with an example embodiment.

Figure 4:
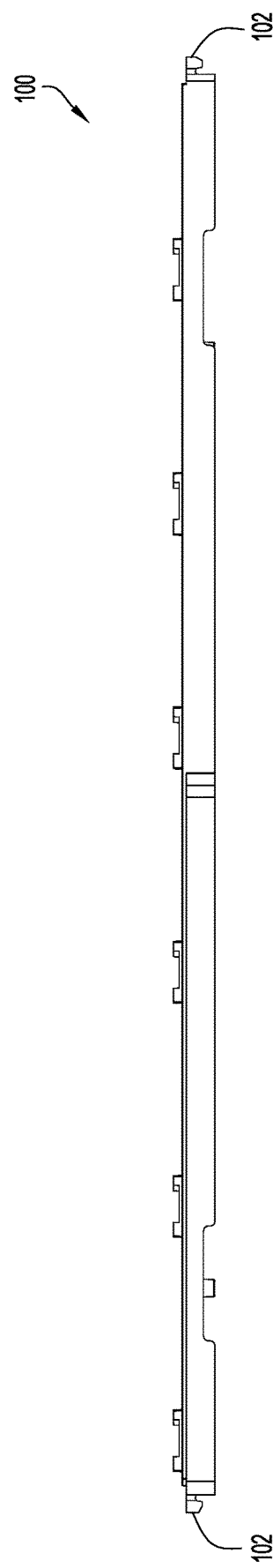
FIG. 4 is a diagram depicting a side view of a tray for optomechanical components, in accordance with an example embodiment.

FIG. 4 is a diagram depicting a side view of a tray 100 for optomechanical components, in accordance with an example embodiment.

Figure 5:
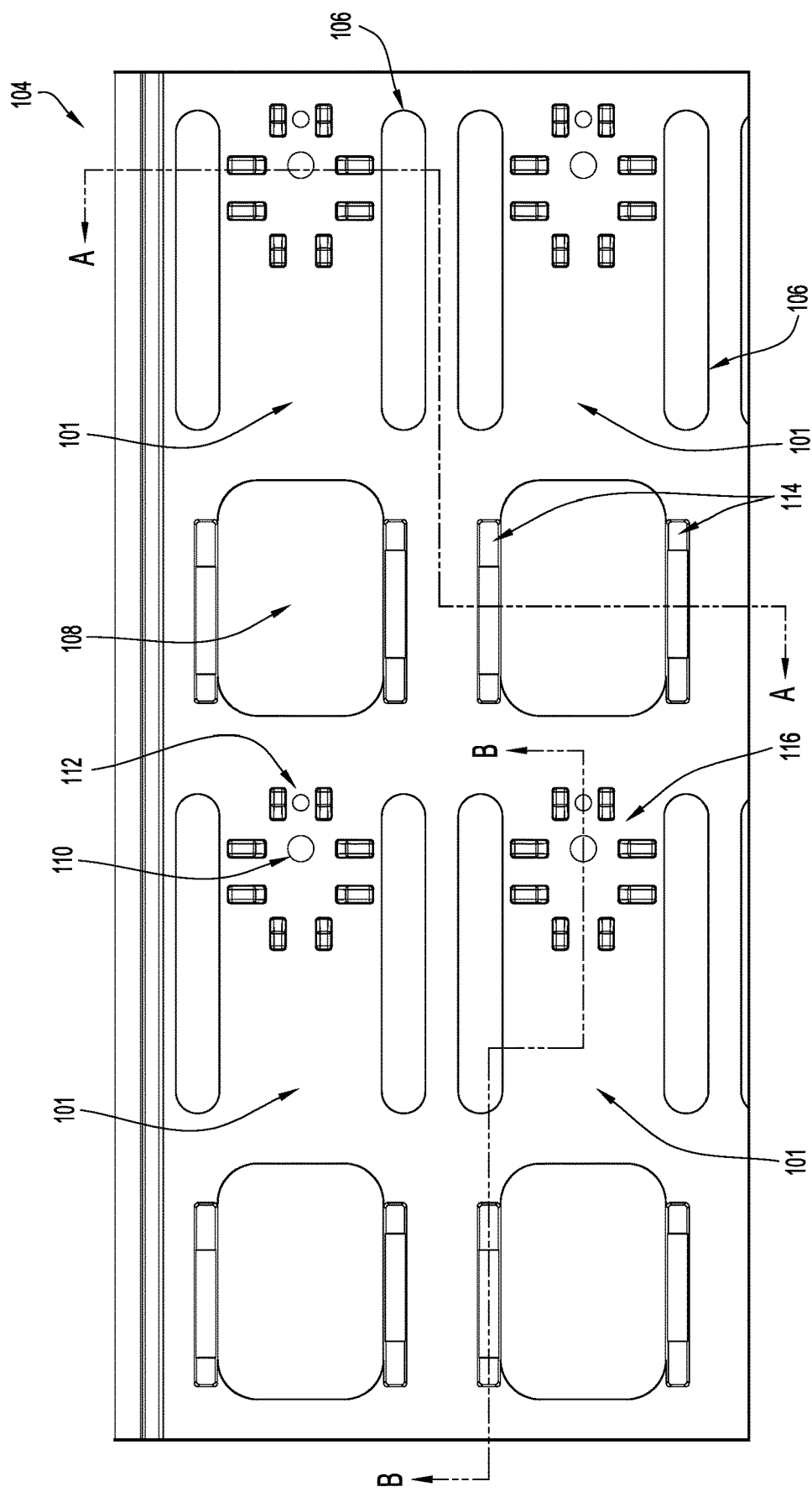
FIG. 5 is a diagram depicting a top view of a portion of a tray for optomechanical components, in accordance with an example embodiment.

FIG. 5 is a diagram depicting a top view of a portion 104 of a tray 100, in accordance with an example embodiment. As depicted, portion 104 includes four pockets 101, each of which may hold one optomechanical component. Each pocket 101 may include two side holes 106, a center hole 108, a vacuum hole 110, a fiducial hole 112, a first cradle element 114 configured to support a clip that attaches to one or more optical fibers of the optomechanical component, and a second cradle element 116 configured to support a head of the optomechanical component. Portion 104 includes two planes for sectional views, plane AA and plane BB, which are depicted in FIGS. 6 and 7, respectively.

Figure 6:
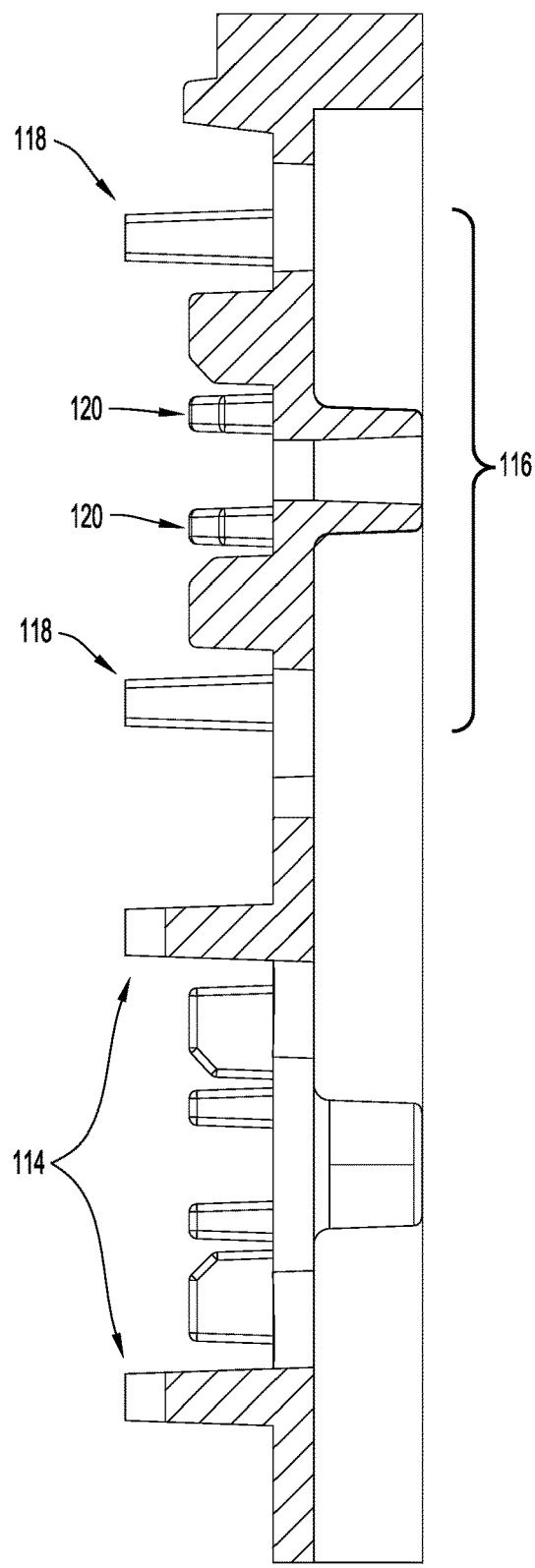
FIG. 6 is a diagram depicting a first sectional view of a portion of a tray for optomechanical components, in accordance with an example embodiment.
Figure 7:
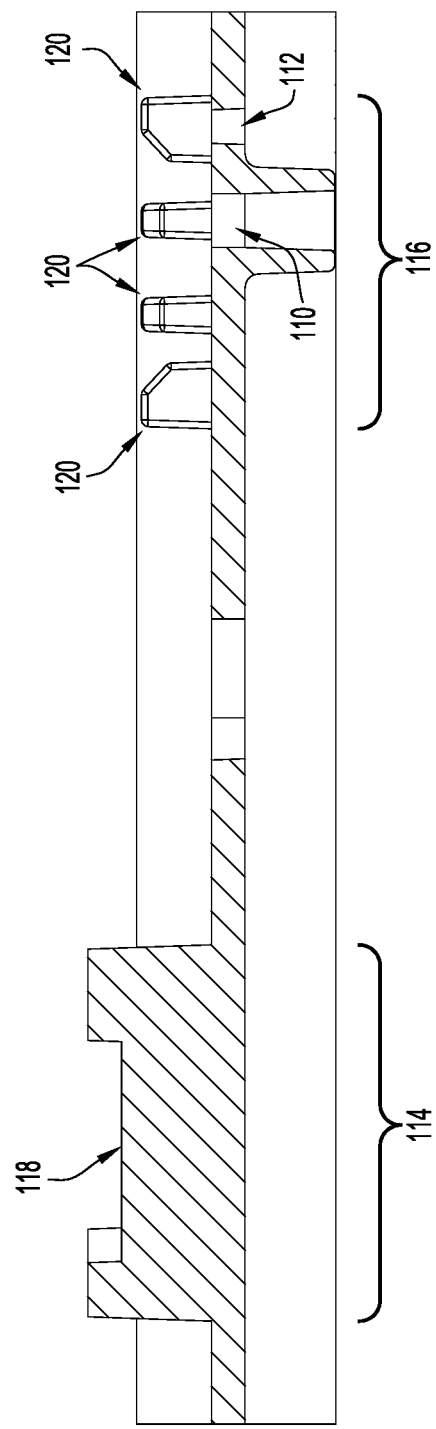
FIG. 7 is a diagram depicting a second sectional view of a portion of a tray for optomechanical components, in accordance with an example embodiment.

FIG. 6 is a diagram depicting a first sectional view of the portion 104 of a tray 100, in accordance with an example embodiment. FIG. 6 depicts a sectional view corresponding to plane AA of FIG. 5. As depicted, the first cradle element 114 has arms 118 that may support an optomechanical component by an attached clip. The second cradle element 116 includes a plurality of fins 120 that support a head of an optomechanical component by surrounding the head to hold the optomechanical component in place. In some embodiments, there are eight fins 120, with two fins 120 per each of the four sides of a head. FIG. 7 is a diagram depicting a second sectional view of the portion 104 of tray 100, in accordance with an example embodiment. FIG. 7 depicts a sectional view corresponding to plane BB of FIG. 5. As depicted, the arm 118 of the first cradle element 114 has an inset portion. The second cradle element 116 includes a plurality of fins 120. Each fin 120 may include a face that is slanted downward, as depicted, toward a space that would be occupied by a head of an optomechanical component placed in the pocket 101. Also depicted are vacuum hole 110 and fiducial hole 112, which are situated adjacent to the second cradle element 116.

Figure 8:
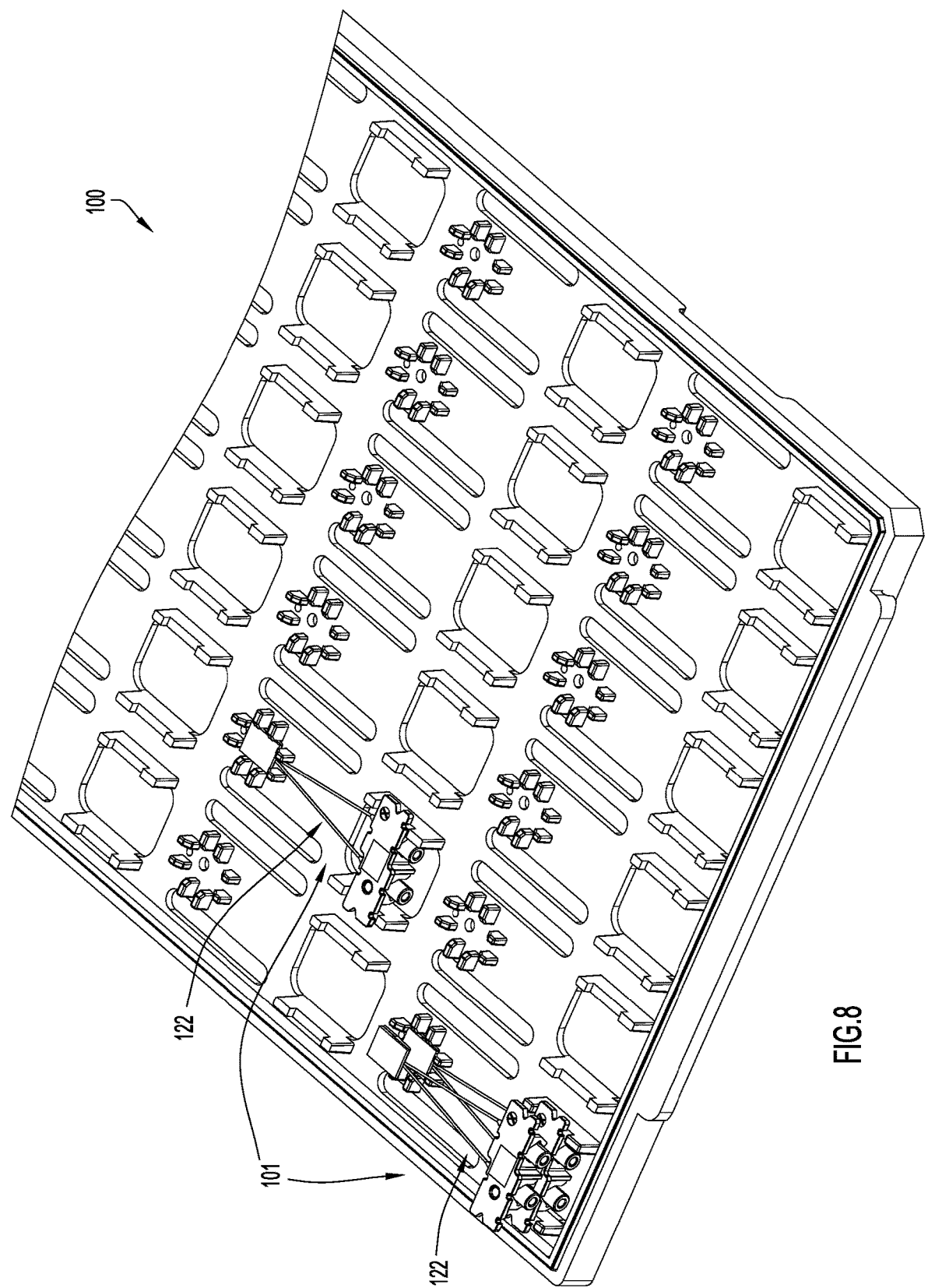
FIG. 8 is a diagram depicting an isometric view of a portion of a tray for optomechanical components, in accordance with an example embodiment.

FIG. 8 is a diagram depicting an isometric view of a portion of a tray 100, in accordance with an example embodiment. As depicted, two pockets 101 of the tray 100 each contain an optomechanical component 122. The optomechanical component 122 may include two flexible optical fibers that are each connected to a same head element. The optomechanical component 122 is described in more detail below in connection with FIGS. 12A and 12B.

Figure 9:
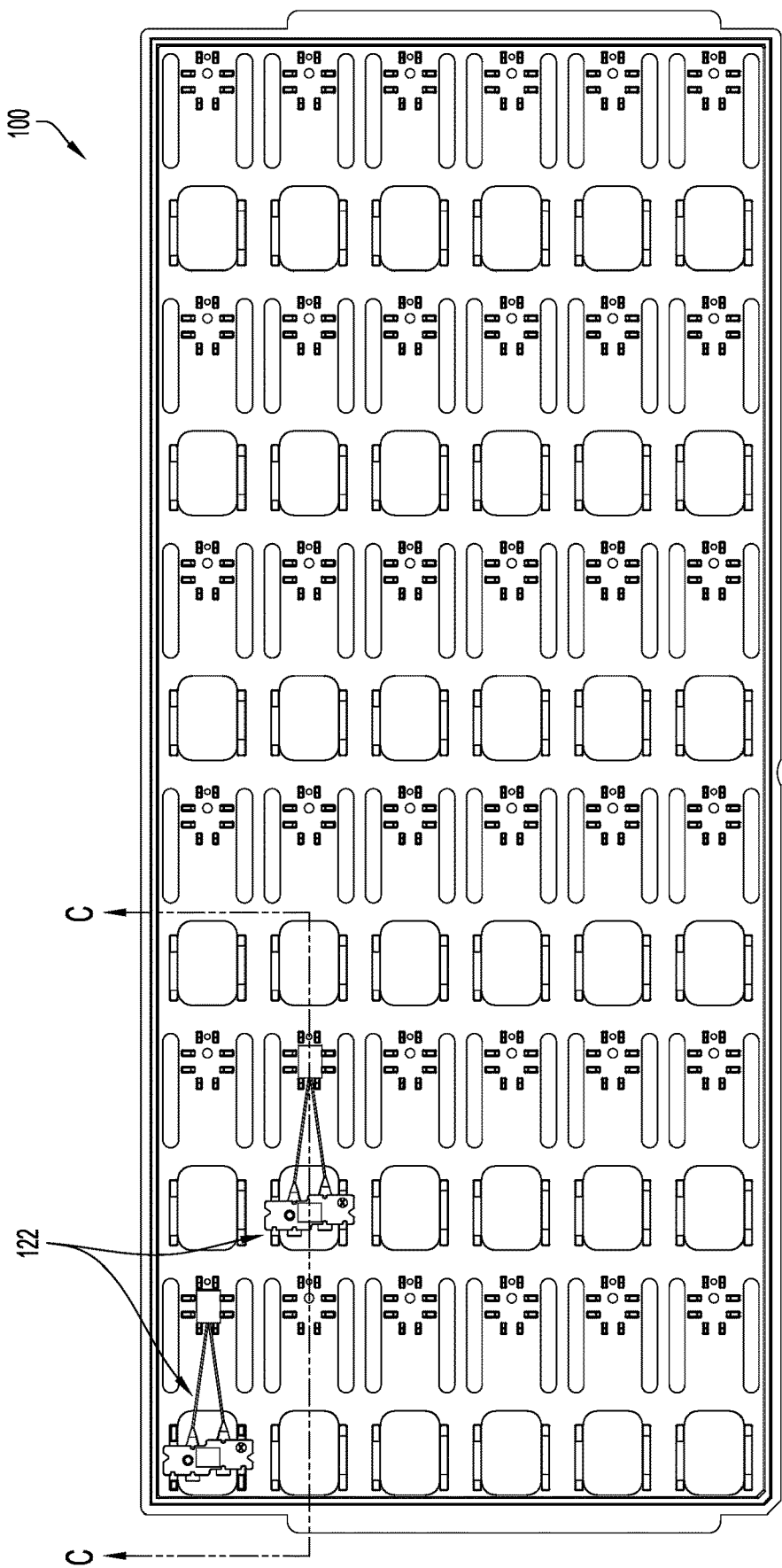
FIG. 9 is a diagram depicting a top view of a tray for optomechanical components and showing optomechanical components mounted in pockets of the tray, in accordance with an example embodiment.

FIG. 9 is a diagram depicting a top view of tray 100 and showing optomechanical components mounted in pockets of the tray, in accordance with an example embodiment. The tray 100 may be stacked upon one or more other trays; in the depicted example, a tray 100 is stacked upon another tray 100 (not shown). The tray 100 includes two optomechanical components 122. FIG. 9 includes a plane CC for a sectional view, which is depicted in further detail in FIG. 10.

Figure 10:
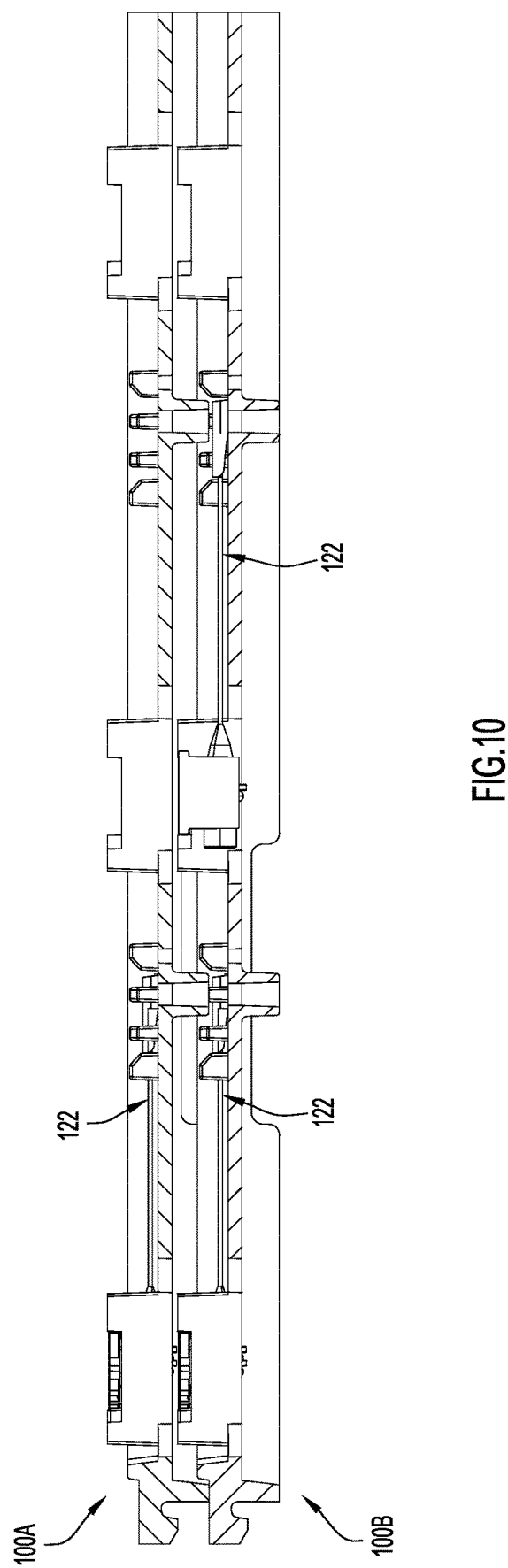
FIG. 10 is a diagram depicting a third sectional view of a portion of a tray for optomechanical components, in accordance with an example embodiment.

FIG. 10 is a diagram depicting a third sectional view of a portion of two stacked trays 100A and 100B for optomechanical components, in accordance with an example embodiment. FIG. 10 depicts a sectional view corresponding to plane CC in FIG. 9. As depicted, there are three optomechanical components 122: one in the top tray 100A, and two in the bottom tray 100B. There is a nominal clearance distance from the top of the glass head element of an optomechanical component 122 to the stacked tray 100B. In some embodiments, the boss may function as a vacuum hole.

Figure 11:
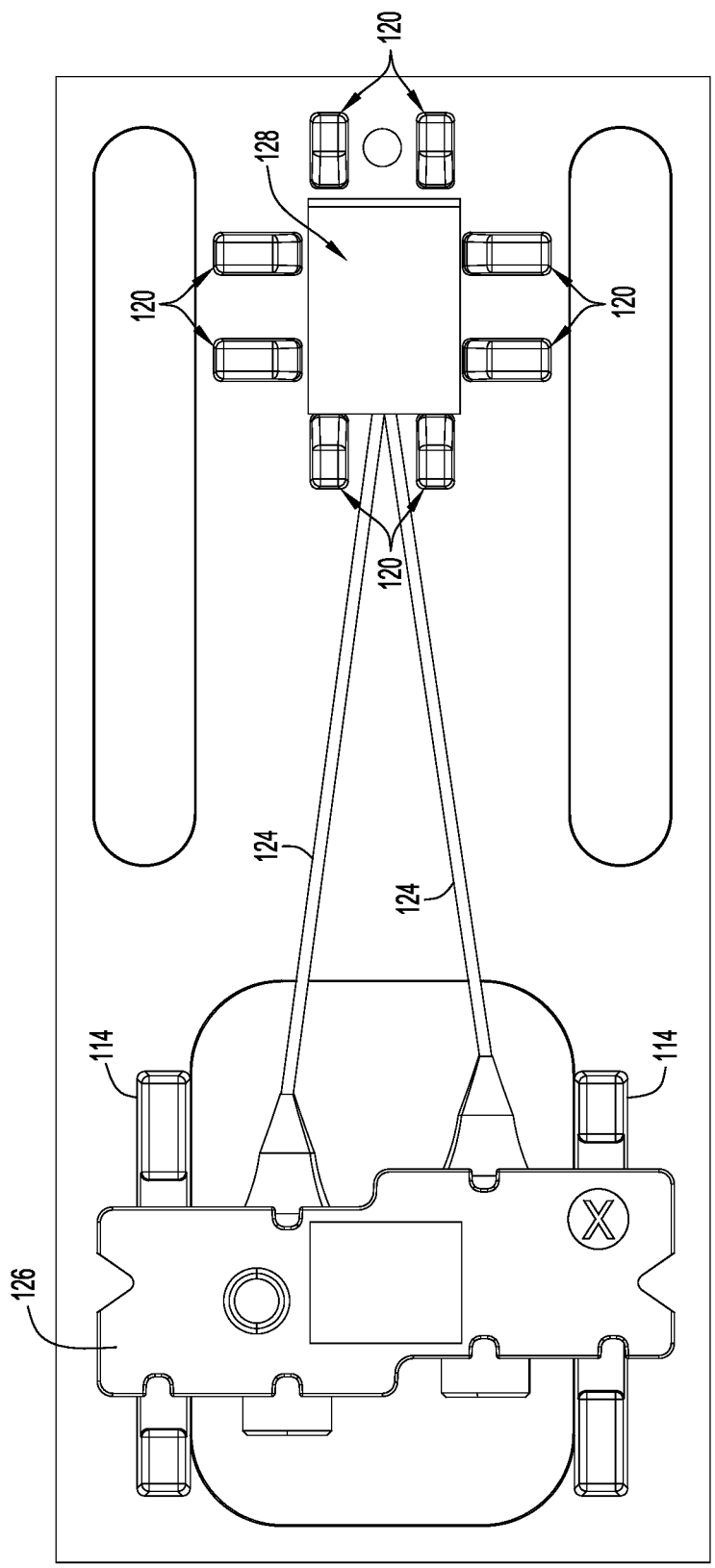
FIG. 11 is a diagram depicting a pocket of the tray with an optomechanical component mounted thereon, in accordance with an example embodiment.

FIG. 11 is a diagram depicting the pocket 101 of the tray 100 with an optomechanical component 122 mounted therein, in accordance with an example embodiment. As depicted, FIG. 11 shows that the optomechanical component 122 that includes two optical fibers 124 that are held together by a clip 126, which also holds the optomechanical component 122 in place in the pocket 101 at the first cradle element 114. Optomechanical component 122 also includes a glass head element 128, which is supported by second cradle element 116 via fins 120. The presence of loose LC ports in two-channel fiber arrays may present additional problems addressed by the arrangement of the clip 126 and pocket 101. In particular, each pocket 101 constrains the barrels of the channels via the interface of the clip 126 and the first cradle element 114 so that, during the pick-up process on a bonder machine, the two barrels may be properly constrained while preventing roll or pitch. To ease the pick-up process, the LC ports may be bound together using the clip 126 that is used as a process piece part. Additionally, fiber lengths of optical fibers 124 in a fiber array may be unequal; for example, fiber lengths in an embodiment presented herein are offset by 1.25 mm. To ensure the planarity of the piece part in the pocket 101 the clip 126 may be supported on the arms 118 of the first cradle element 114.

The pocket 101 can hold the glass head element 128 of the optomechanical component 122 as shown, allowing for variation in the glass head size in all directions while also preventing excessive lateral movement during transportation. Moreover, the pocket design may enable fingers of a mechanical gripper to grab the glass head element 128 from the sides of the head.

Figure 12B:
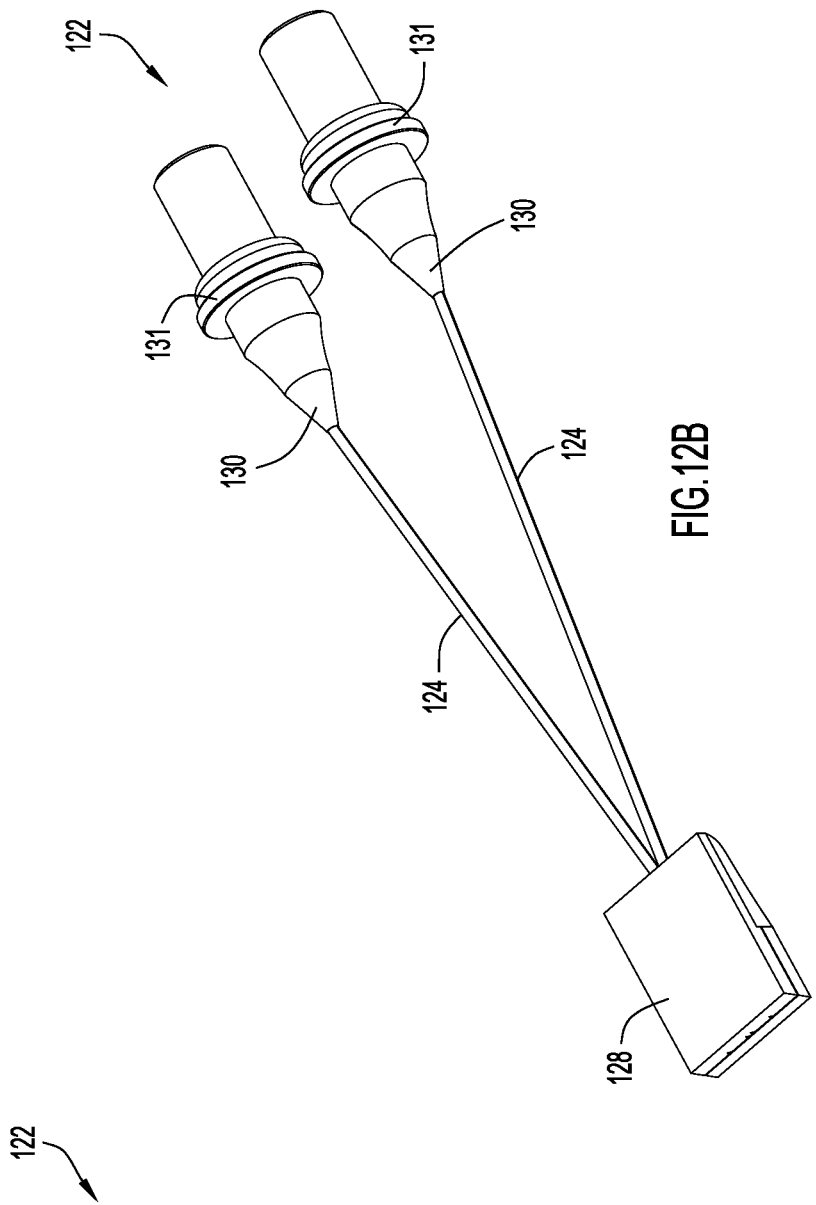
FIG. 12B is a diagram depicting an isometric view of an optomechanical component, in accordance with an example embodiment.
Figure 12A:
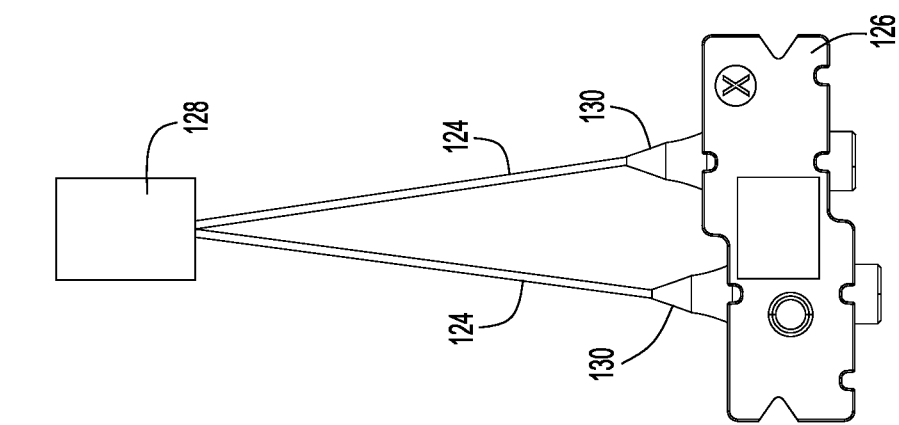
FIG. 12A is a diagram depicting a top view of an optomechanical component, in accordance with an example embodiment.

With reference to FIGS. 12A and 12B, the optomechanical component 122 is described in more detail. As depicted, the optomechanical component 122 is a fiber array that includes the glass head element 128 and two LC ports 130 on the ends of optical fibers 124 opposite the head element 128. The optical fibers 124 are held together by clip 126. The head element 128 may include a polished glass lid, a glass v-groove substrate, stripped optical fiber, and clear epoxy holding these components together, rendering the entire fiber array head near-transparent. Since the transparency of the head element 128 may cause trouble during visioning, a fiducial hole (not shown) is provided for each pocket. The v-grooves of substrate are used for locating the position of the head in one direction, while the fiducial hole on the tray aids in locating in the other direction.

FIG. 12B is a diagram depicting an isometric view of an optomechanical component 122, in accordance with an example embodiment. The optomechanical component 122 is depicted without a clip 126, and includes a head element 128 and two optical fibers 124, each having an LC port 130 attached at the end. Each LC port 130 has a flange 131 at which the diameter of the LC port 130 increases. The cylindrical portion of each LC port 130 may be alternatively referred to as a barrel. Without the clip 126 to hold the LC ports 130 together, the flexible nature of the optical fibers 124 may cause damage to the optomechanical component 122 during handling.

Figure 12D:
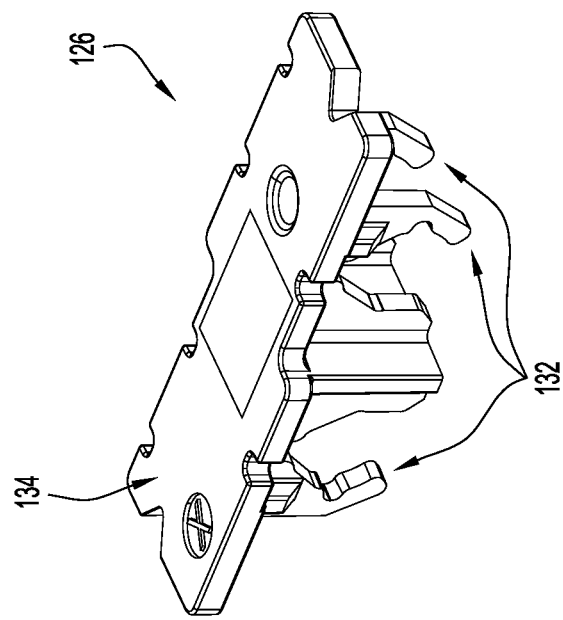
FIG. 12D is a diagram depicting an isometric view of a clip for an optomechanical component, in accordance with an example embodiment.
Figure 12C:
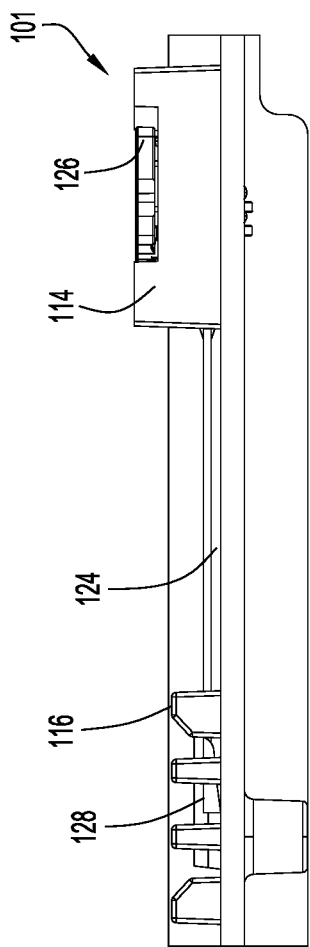
FIG. 12C is a diagram depicting a side view of the pocket of a tray, in accordance with an example embodiment.

FIG. 12C is a diagram depicting a side view of the pocket 101, in accordance with an example embodiment. Optomechanical component 122 is supported at the head element 128 at one end by the second cradle element 116, and is supported by the clip 126, that attaches to the optical fibers 124, and rests in the first cradle element 114.

FIG. 12D is a diagram depicting an isometric view of the clip 126, in accordance with an example embodiment. As depicted, clip 126 has a plurality of gripping elements 132 for holding optical fibers 124. Clip 126 also includes a body portion 134 with edges that can be supported by the first cradle element 114.

Reference is now made to FIGS. 13A and 13B. As depicted, the pocket 101 includes side holes 106, the center hole 108, the vacuum hole 110, the fiducial hole 112, the first cradle element 114 configured to support the clip 126 that attaches to one or more optical fibers of the optomechanical component 122, and the second cradle element 116 configured to hold a head element 128 of an optomechanical component. The fiducial hole 112 provides a point of reference for an image recognition system, thereby enabling for an automated system to deposit or remove a fiber array to/from the pocket 101. Trays 100 may be placed upon an elevated platform 136 when stacked so that the head elements 128 optomechanical components 122 can lie flat without causing interference when trays are stacked.

Figure 14A:
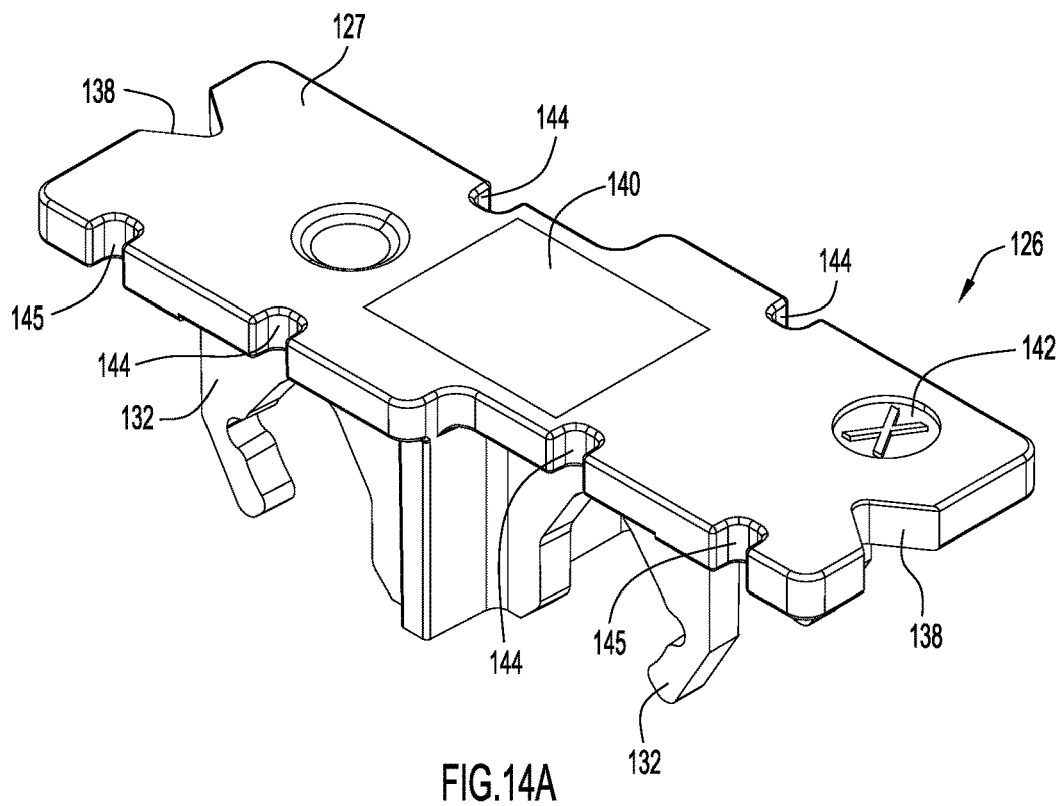
FIG. 14A is a diagram depicting an isometric view of a clip for an optomechanical component, in accordance with an example embodiment.
Figure 14B:
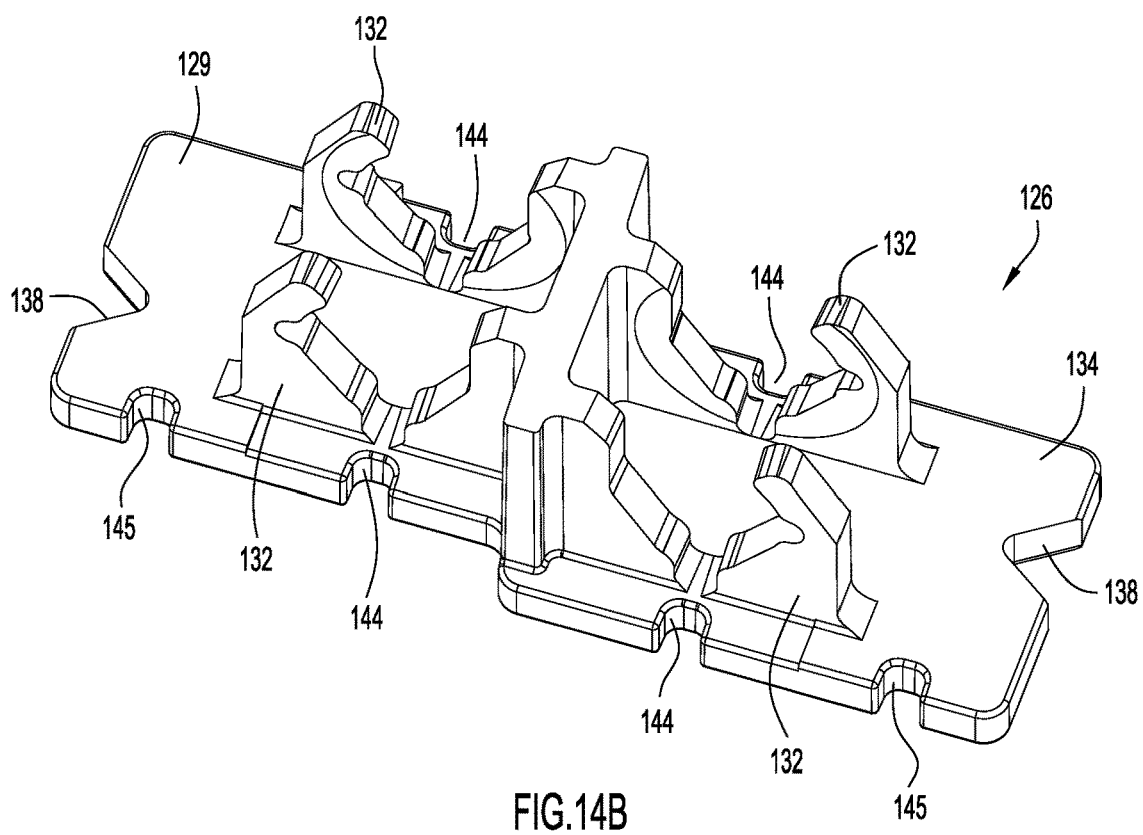
FIGS. 14B and 14C are diagrams depicting an isometric view of a clip for an optomechanical component, in accordance with an example embodiment.

Reference is now made to FIGS. 14A and 14B. FIGS. 14A and 14B are more detailed diagrams depicting isometric views of clip 126, in accordance with an example embodiment. As depicted, clip 126 includes a top face 127, a bottom face 129, four gripping elements 132, notches 138, an area 140, a fiducial 142, notches 138, and cutouts 144 and 145. In some embodiments, the clip 126 is made of a thermoplastic, such as polyetherimide and/or polypropylene, and is formed via injection molding. The gripping elements 132 are arranged in pairs so that each pair of gripping elements 132 can hold the barrel of an LC port 130. When a clip 126 is attached to optomechanical component 122 (shown in previous figures) by placing the gripping elements 132 around both LC ports 130 (shown in previous figures), the clip 126 constrains the LC ports 130 together in a manner that constrains the axes of the LC ports 130 parallel to each other. The body of clip 126 is offset, as depicted, in an asymmetrical manner to accommodate a difference in lengths of optical fibers 124, which causes the LC ports 130 to be offset as well.

A pair of notches 138 are provided on opposite sides of the body of clip 126. Each notch 138 may mate with an external stabilizing element to constrain clip 126. Area 140 includes a flat portion on the top face of the body of clip 126. In particular, a vacuum tip may contact area 140 such that, when a negative pressure is applied by the vacuum tip, clip 126 may be picked up at area 140. Fiducial 142 provides a visual aid for use by external equipment in identifying clip 126 and to provide a point of reference for orienting the external equipment about clip 126. Cutouts 144 enable flexing of the body of clip 126, such as during insertion of the LC ports 130 into gripping elements 132. Cutouts 145 enable flexing of the body of clip 126 as well, and are provided on one side of clip 126 as a visual aid for a technician to readily distinguish the orientation of clip 126 (i.e., one side of clip 126 includes two cutouts 144, whereas the other side includes two cutouts 144 and two cutouts 145).

Figure 14C:
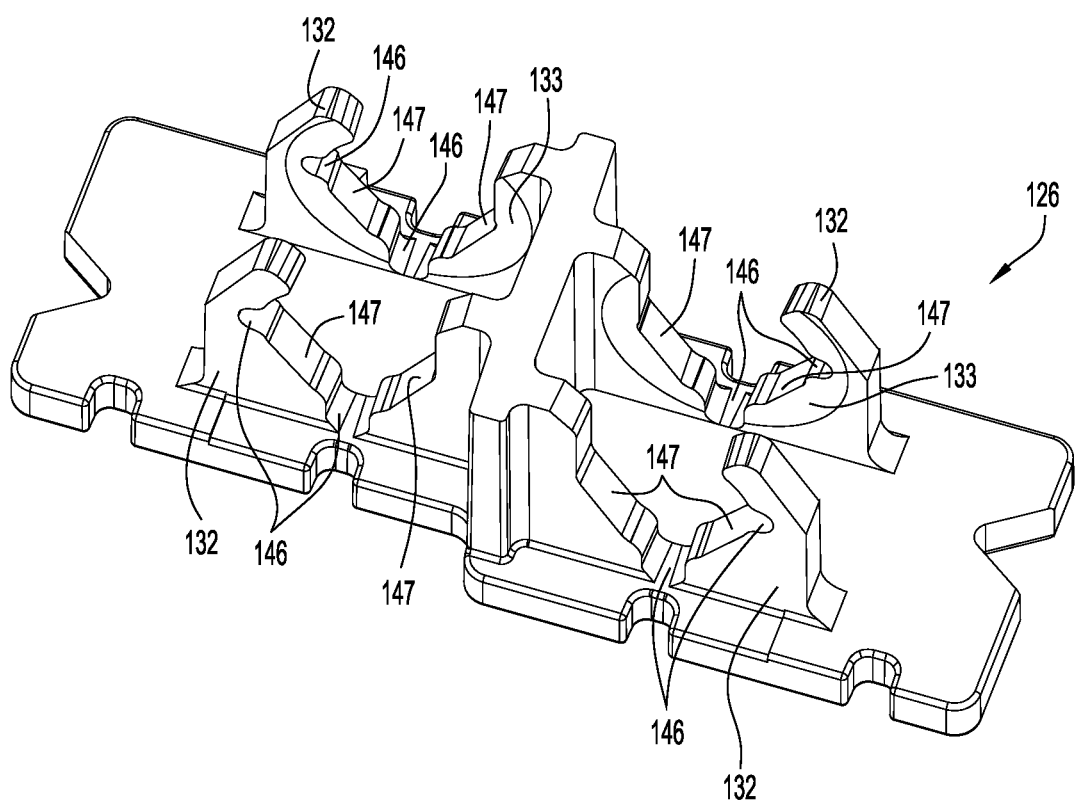

Reference is now made to FIG. 14C. FIG. 14C is a diagram depicting an isometric view of a clip 126 for an optomechanical component, in accordance with an example embodiment. As depicted, details of the gripping elements 132 are shown, including inset portions 133, grip cutouts 146, and flat portions 147. An inset portion 133 may be provided in the interior side of a gripping element 132 in order to mate with a flange 131 of an LC port 130. Grip cutouts 146 enable a gripping element 132 to flex during insertion of an LC port 130. Flat portions 147 contact the surface of an LC port 130 when the LC ports 130 are constrained in accordance with embodiments presented herein. In particular, a force is applied to cause LC ports 130 to move toward the bottom face of clip 126, bringing each LC port 130 in contact with one or more of the flat portions 147.

Figure 15A:
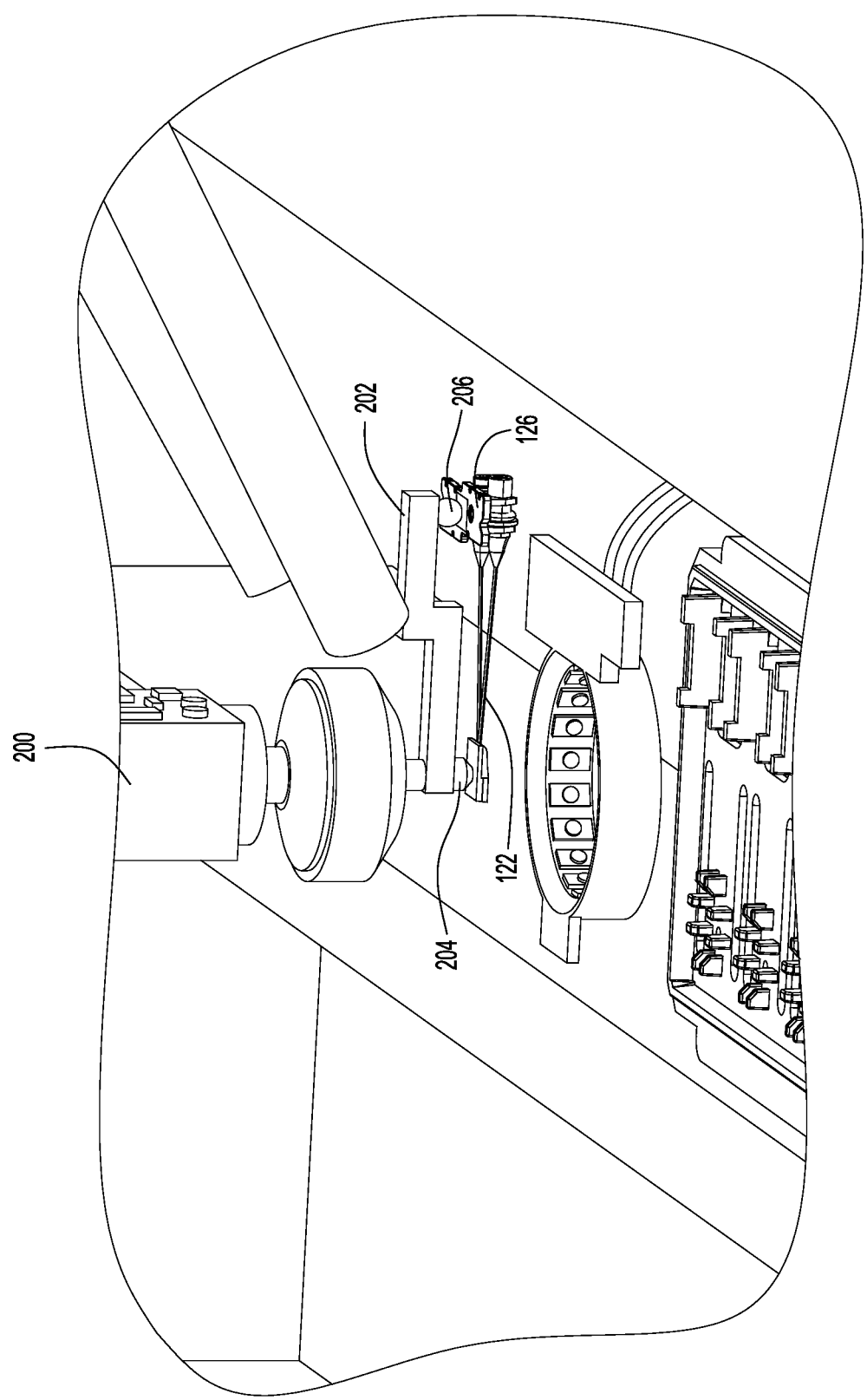

Reference is now made to FIGS. 15A and 15B. FIGS. 15A and 15B are diagrams depicting a vacuum tip tool 202 of a bonding machine 200 engaging an optomechanical component assembly, in accordance with an example embodiment. Reference is also made to FIG. 8, which shows an optomechanical component assembly including optomechanical component 122 and clip 126 in a pocket 101 of tray 100. Bonding machine 200 controls movement of vacuum tip tool 202 in order to position vacuum tip tool 202 over an optomechanical component assembly, which may be housed in a pocket 101 of tray 100. Vacuum tip tool 202 includes a first vacuum tip 204 and a second vacuum tip 206. The first vacuum tip 204 may be placed in contact with the head element 128 of optomechanical component 122, and the second vacuum tip 206 may be placed in contact with clip 126 such that, when negative pressure is applied, suction is provided at the first vacuum tip 204 and second vacuum tip 206 to enable lifting of the optomechanical component assembly when vacuum tip tool 202 is moved in an upward direction. Vacuum tip tool 202 may continue to hold the optomechanical component assembly as long as the negative pressure is applied.

Figure 16:
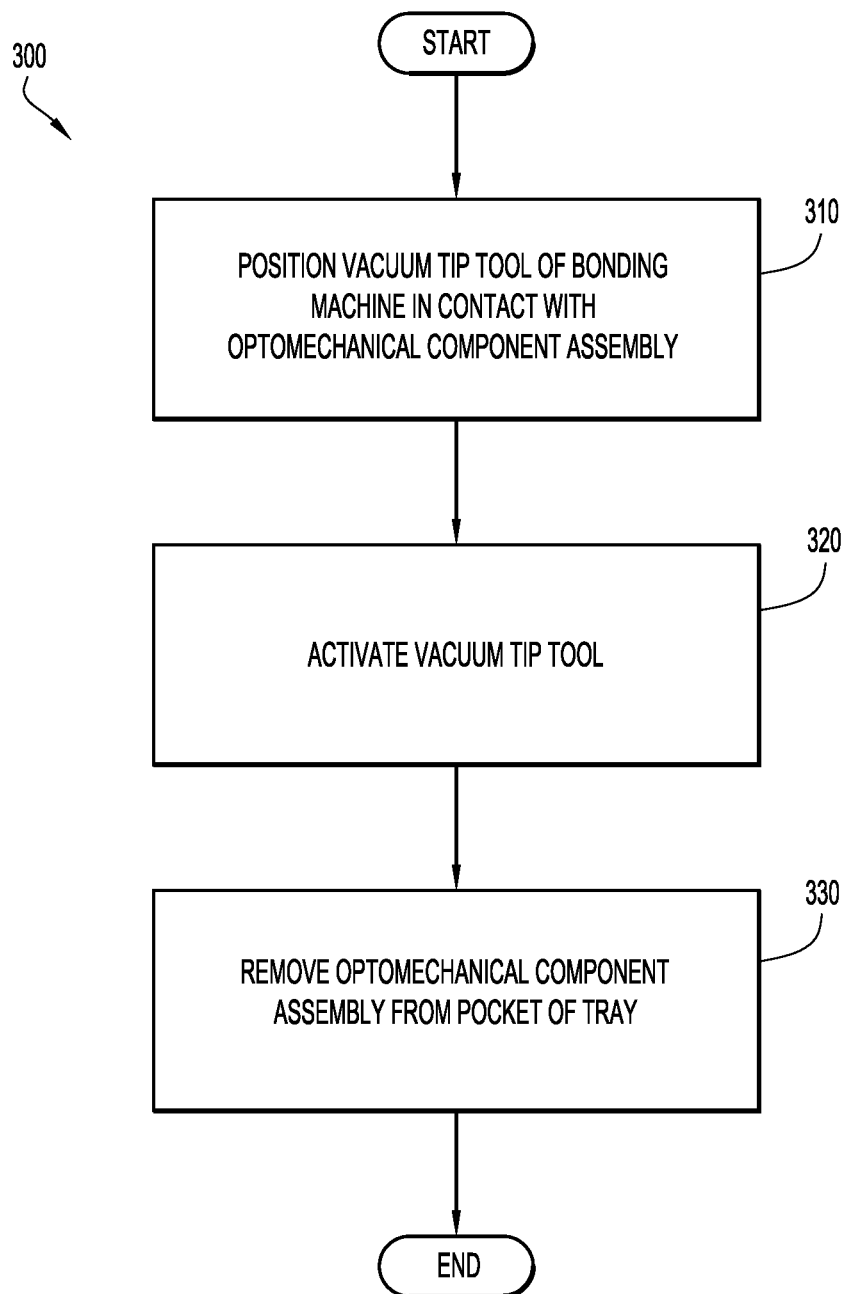
FIG. 16 is a flow chart depicting a method of engaging an optomechanical component assembly using a vacuum tip tool, in accordance with an example embodiment.

FIG. 16 is a flow chart depicting a method 300 of engaging an optomechanical component assembly using a vacuum tip tool, in accordance with an example embodiment. Reference is also made to FIGS. 15A and 15B in connection with the description of FIG. 16.

The vacuum tip tool 202 of a bonding machine 200 is positioned in contact with an optomechanical component assembly at operation 310. Bonding machine 200 may identify an optomechanical component assembly by a fiducial, such as fiducial 142 of clip 126 and/or fiducial hole 112 of pocket 101. Bonding machine 200 may include a visioning system for identifying fiducials by analyzing image data captured by a camera. Based on the positions of the identified one or more fiducials, vacuum tip tool 202 is brought into contact with optomechanical component assembly. In particular, a first vacuum tip 204 is brought into contact with head element 128 of optomechanical component 122, and a second vacuum tip 206 is brought into contact with area 140 on the top face of clip 126.

The vacuum tip tool 202 is activated at operation 320. Activating vacuum tip tool 202 applies negative pressure at vacuum tips 204 and 206 by providing vacuum suction. Vacuum tip tool 202 may be activated in response to bringing vacuum tips 204 and 206 into contact with the optomechanical component assembly.

The optomechanical component assembly is removed from pocket 101 of tray 100 at operation 330. Bonding machine 200 may move vacuum tip tool 202 in an upward or outward direction to lift the optomechanical component assembly, which is held in contact with vacuum tips 204 and 206 due to the negative pressure being applied.

Reference is now made to FIG. 17A. FIG. 17A is a diagram depicting an optomechanical component assembly prior to being constrained, in accordance with an example embodiment. As depicted, the optomechanical component assembly includes optomechanical component 122 and clip 126, which rests on saddle elements 402. Stabilizing elements 404 are positioned below the optomechanical component assembly, and LC ports 130 hang loosely in gripping elements 132 of clip 126.

Reference is now made to FIG. 17B. FIG. 17B is a diagram depicting an optomechanical component assembly that is constrained, in accordance with an example embodiment. Stabilizing elements 404 have fingers that mate with notches 138 of clip 126, preventing movement of clip 126. Block element 406 approaches the bottom face of clip 126 to apply a force to LC ports 130, bringing LC ports 130 flush with flat portions 147 of gripping elements 132 to constrain LC ports 130 in a manner that prevents translational and rotational movement of LC ports 130. When LC ports 130 are mechanically constrained, ferrules may engage each LC ports 130 so that a laser source can emit photons down optical fibers 124. When a ferrule engages with an LC port 130, a force of 1-2 N may be applied in a direction to cause flanges 131 to press against gripping elements 132 at inset portions 133.

Figure 18:
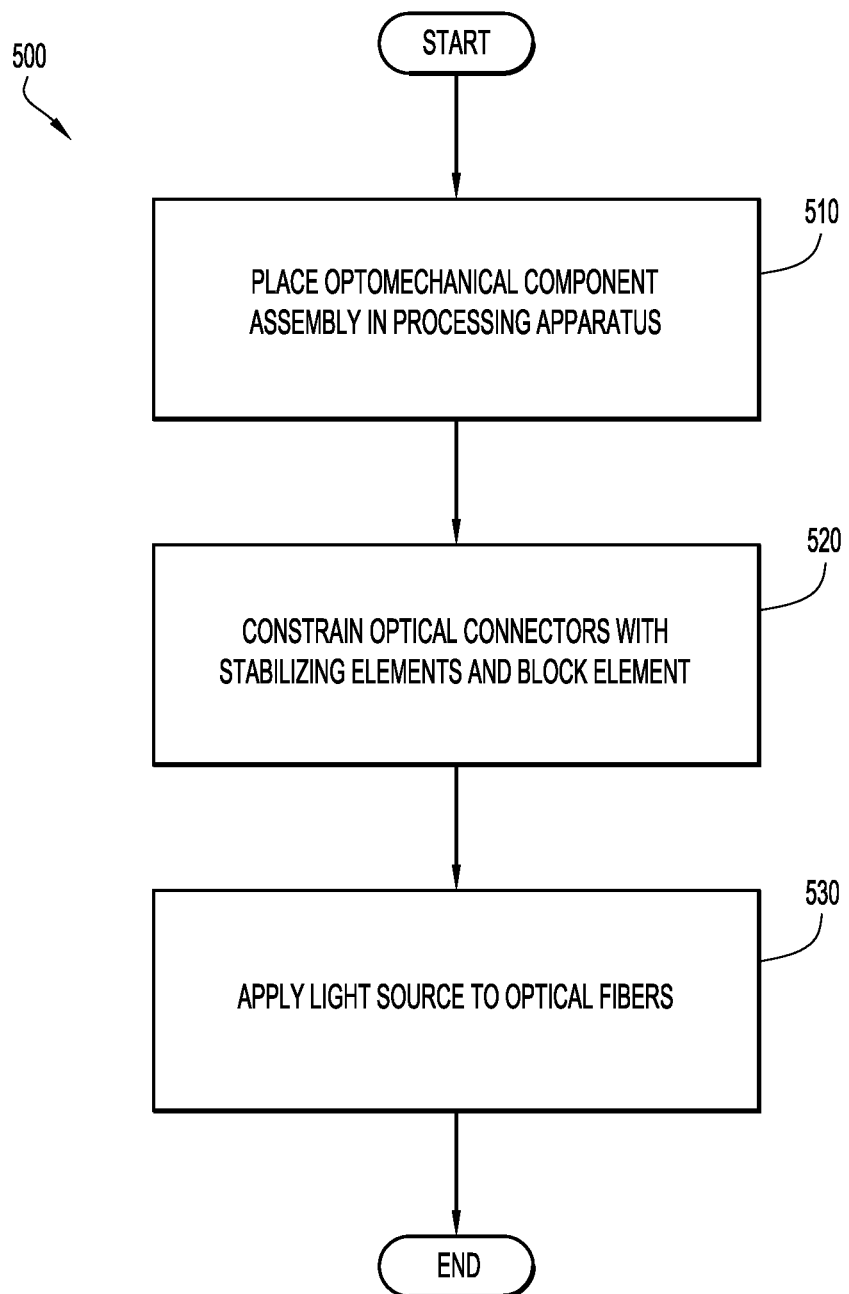
FIG. 18 is a flow chart depicting a method of constraining an optomechanical component assembly, in accordance with an example embodiment.

Reference is now made to FIG. 18. FIG. 18 is a flow chart depicting a method 500 of constraining an optomechanical component assembly, in accordance with an example embodiment. Reference is also made to FIGS. 17A and 17B for purposes of the description of FIG. 18.

An optomechanical component assembly is placed in a processing apparatus, such as that shown in FIGS. 17A and 17B, at operation 510. The optomechanical component assembly may be supported by saddle elements 402, which support clip 126 of the optomechanical component assembly.

The optical connectors (e.g., LC ports 130) are constrained with stabilizing elements 404 and block element 406 at operation 520. Stabilizing elements 404 may include fingers that mate with notches 138 of clip 126. Stabilizing elements 404 apply a force toward each other to place clip 126 in compression, thereby preventing movement of clip 126 in lateral directions. Block element 406 contacts LC ports 130, applying a force to each LC port 130 to push the LC ports 130 toward the bottom face of clip 126, bringing LC ports 130 in contact with flat portions 147 of gripping elements 132.

A light source is applied to the optical fibers 124 at operation 530. The light source may be provided by a laser, and is applied to LC ports 130 so that emitted photons travel within optical fibers 124, which act as waveguides. Ferrules may engage with each LC port 130 to guide the laser light to the LC ports 130. In some embodiments, the application of a laser source to the LC ports 130 (and therefore optical fibers 124) enables alignment of a lens in an optical chip with which the optomechanical component 122 may be associated. Because the lens redirects light from optical fibers 124 to the optical chip, a lens may be aligned in order to change the direction in which light is redirected (e.g., to maximize the amount of light being redirected in a particular direction).

Figure 19B:
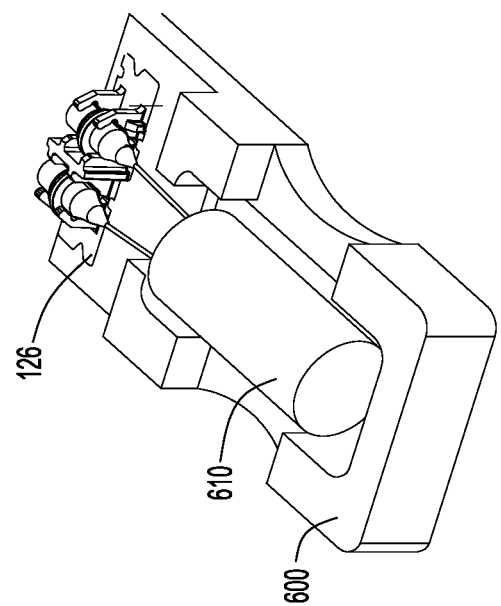
FIG. 19B is a diagram depicting an isometric view of a carrier and an optomechanical component assembly, in accordance with an example embodiment.
Figure 19A:
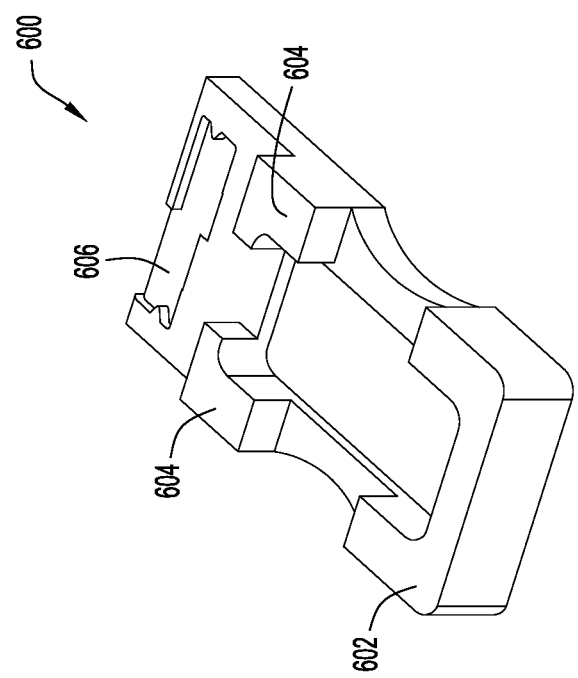
FIG. 19A is a diagram depicting an isometric view of a carrier, in accordance with an example embodiment.

Reference is now made to FIG. 19A. FIG. 19A is a diagram depicting an isometric view of a carrier 600 for an optomechanical component assembly, in accordance with an example embodiment. As depicted, carrier 600 includes a first confining element 602, a pair of second confining elements 604, and an inset portion 606. The first confining element 602 and pair of second confining elements 604 together hold an optomechanical component assembly; the gap between the pair of second confining elements 604 enables passage of optical fibers 124. Inset portion 606 is adapted to receive clip 126, which contacts carrier 600 at the top face of clip 126.

Reference is now made to FIG. 19B. FIG. 19B is a diagram depicting an isometric view of carrier 600 and an optomechanical component assembly, in accordance with an example embodiment. Optomechanical component assembly further includes a sleeve 610, which surrounds the head element 128 and a portion of each optical fiber 124. The sleeve 610 may be composed of a rigid or semi-rigid material, such as rubber or neoprene. The first confining element 602 and the pair of second confining elements 604 together hold the sleeve 610 in place when the optomechanical component assembly is placed in the carrier 600. Clip 126 mates with inset portion 606 to hold the optomechanical component assembly in place.

Figure 19C:
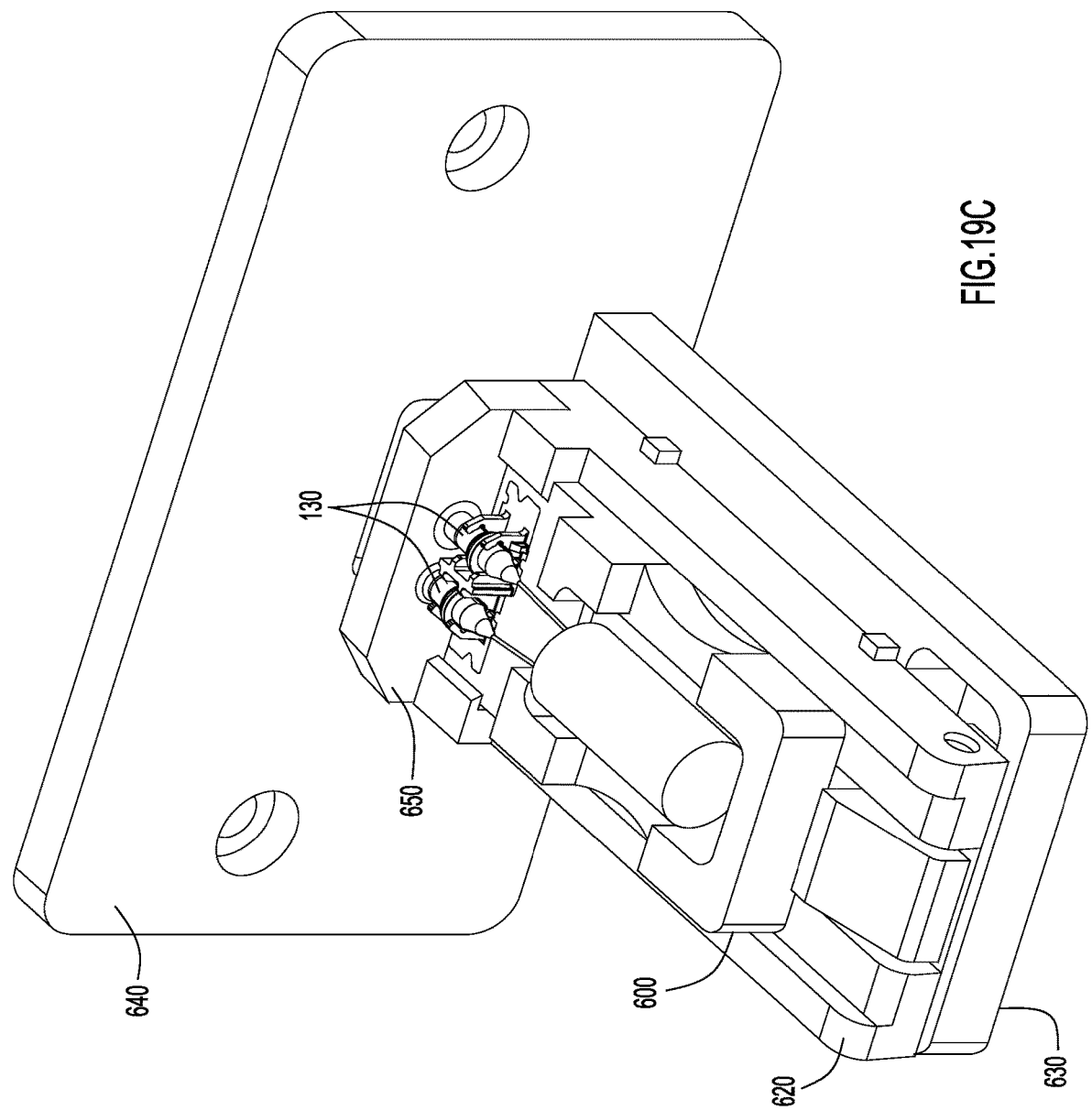
FIGS. 19C and 19D are diagrams depicting an isometric view of a carrier and an optomechanical component assembly in a sliding module of a fixture, in accordance with an example embodiment.
Figure 19D:
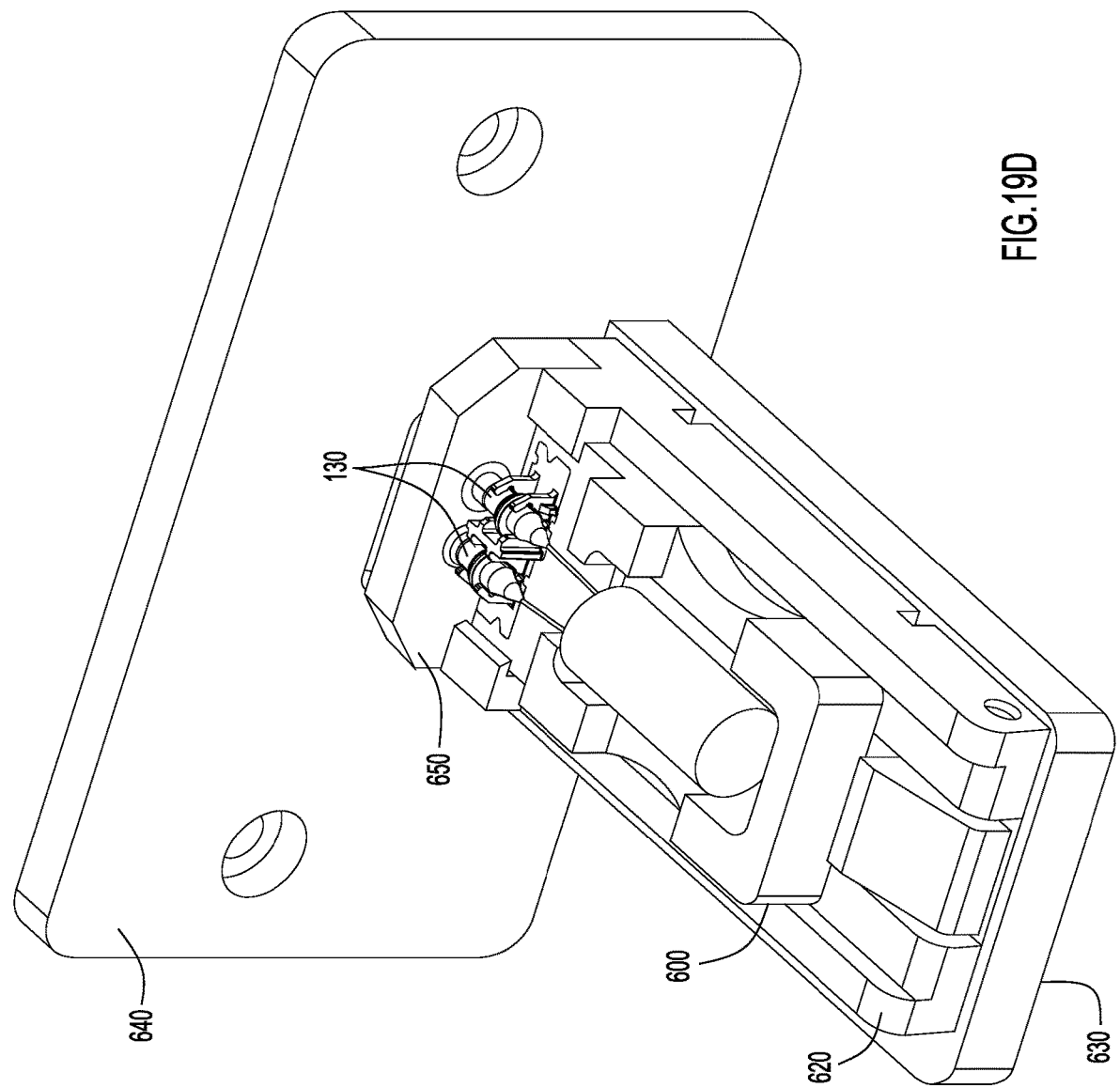

Reference is now made to FIGS. 19C and 19D. FIGS. 19C and 19D are diagrams depicting an isometric view of a carrier 600 and an optomechanical component assembly in a sliding module 620 of a fixture 640, in accordance with an example embodiment. The optomechanical component assembly and carrier 600 may be inserted into sliding module 620, which rests on track 630. The interface between sliding module 620 and track 630 enables translational movement of sliding module 620 in one direction, so that each LC ports 130 of the optomechanical component 122 may interface with an examination element 650 of fixture 640.

Figure 20:
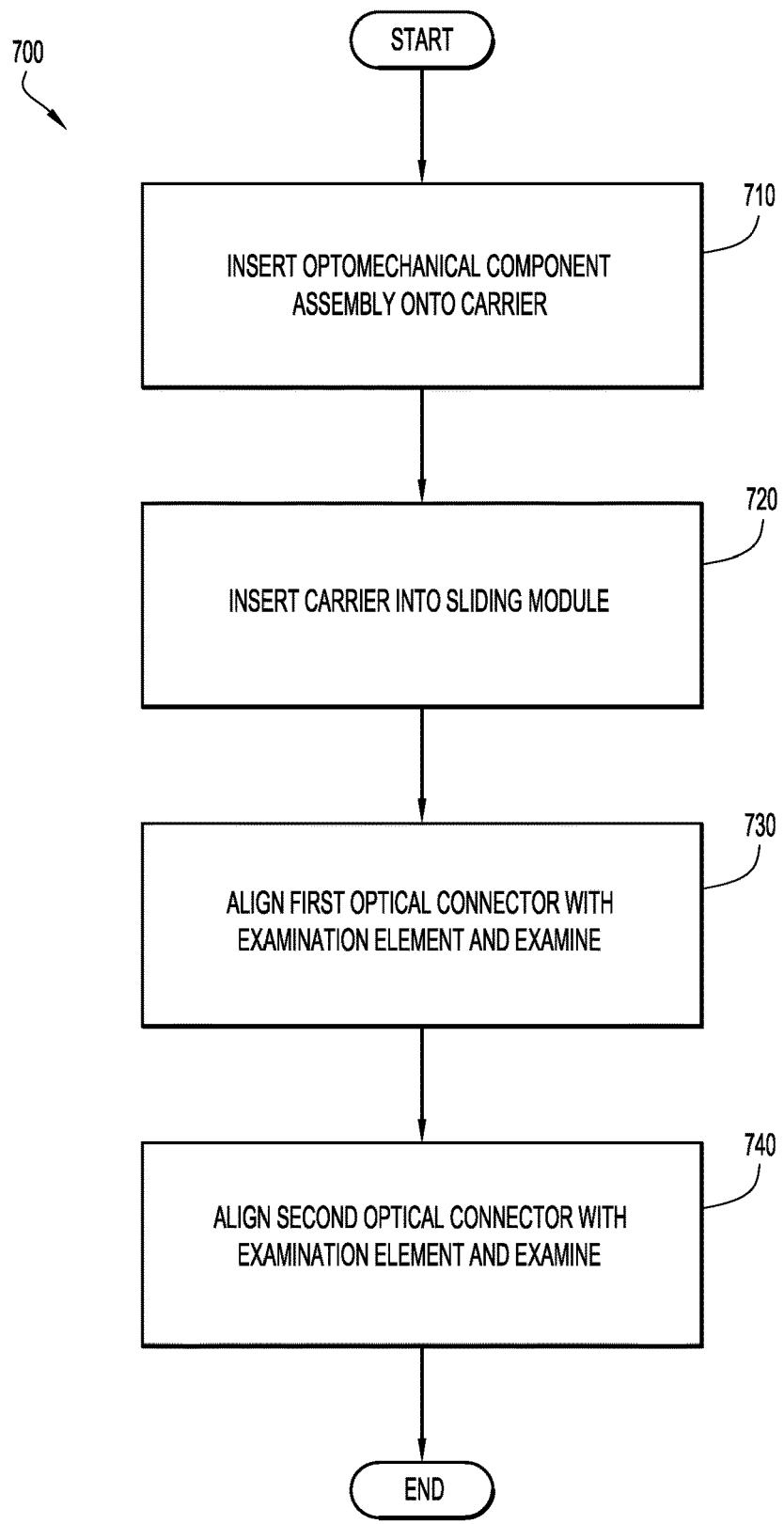
FIG. 20 is a flow chart depicting a method of examining an optomechanical component, in accordance with an example embodiment.

Reference is now made to FIG. 20. FIG. 20 is a flow chart depicting a method 700 of examining an optomechanical component, in accordance with an example embodiment. Reference is also made to FIGS. 19C and 19C for purposes of the description of FIG. 20.

An optomechanical component assembly is inserted onto a carrier at operation 710. An optomechanical component assembly, including an optomechanical component 122, clip 126, and sleeve 610, is placed into carrier 600 to present the LC ports 130 for inspection. By placing the optomechanical component such that the top face of clip 126 is oriented downward, the force of gravity pulls the LC ports 130 into contact with the flat portions 147 of gripping elements 132.

The carrier is inserted into a sliding module at operation 720. The sliding module 620 is configured to receive carrier 600 such that the LC ports 130 of the optomechanical component 122 can be aligned with an examination element 650 of fixture 640 to which the sliding module 620 is attached.

The first optical connector is aligned with an examination element and examined at operation 730. The sliding module 620 may be moved to place an LC port 130 in alignment with an examination element 650, and the optomechanical component 122 may be examined accordingly. Similarly, the second LC port 130 is aligned with the examination element 650 and examined at operation 740. Examination element 650 may image LC ports 130 with one or more cameras so that a technician may visually inspect details such as the presence of contaminants, concentricity of the LC ports, and the like.

In one use case, and with reference to FIG. 1, the tray 100 may be loaded onto an adapter bay of a fiber array bonder machine, and a steel plate of the adapter may include clips to grip the tray by its sides. The steel plate may include a reflective material, such as a tape, so that the light passes through the fiducial hole 112 and reflects back during visioning. Thus, the fiber array bonder's cameras may initiate a search algorithm to locate a fiber array in the tray. Vacuum hole 110 can mate with a vacuum nipple fitting such that the vacuum can pull down on each optomechanical component 122 when the tray is ready for the pick-up process. The fiber array bonding equipment may include a two-pointed vacuum tip tool that picks up optomechanical components 122 by their glass head elements 128 and the body of each clip 126.

In one form, an apparatus is provided comprising: a tray having a plurality of pockets arranged in an array, wherein each pocket is configured to hold an optomechanical component, and wherein each pocket includes: at least one fiducial hole; at least one vacuum hole; a first cradle element configured to support a clip that attaches to one or more optical fibers of the optomechanical component; and a second cradle element configured to support a head of the optomechanical component. In a further form, the plurality of pockets comprises thirty-six pockets arranged in a six-by-six array.

In another form, the tray has dimensions corresponding to a generic matrix tray for handling and shipping defined according to Joint Electron Device Engineering Council (JEDEC) Solid State Technology Association Publication Number 95 Design Guide 4.10 and variations thereof. In another form, the tray is composed of a carbon-filled glass composite. In another form, the tray is composed of a material having a static dissipative surface resistivity of between $10^5$ to $10^{12}$ ohms/square.

In another form, the tray is configured to be stacked onto an additional one or more trays. In another form, the tray is configured to support an additional one or more trays stacked upon the tray.

In one form, an apparatus is provided comprising: an optomechanical component comprising a head portion that joins a first optical fiber and a second optical fiber at a first end of each optical fiber, a first optical connector attached to a second end of the first optical fiber, a second optical connector attached to a second end of the second optical fiber, and a clip having a body portion and a plurality of gripping elements that attach to the first optical connector and the second optical connector to join the first optical fiber and the second optical fiber; and a tray having a plurality of pockets arranged in an array, wherein each pocket of the tray includes: at least one fiducial, at least one vacuum hole, a first cradle element that supports the clip of the optomechanical component, and a second cradle element that supports the head portion of the optomechanical component.

In another form, the first optical connector and/or the second optical connector comprises a Lucent Connector (LC) port. In another form, the first optical fiber and the second optical fiber have different lengths.

In another form, the plurality of pockets comprises thirty-six pockets arranged in a six-by-six array.

In another form, the at least one vacuum hole is configured to mate with a vacuum nipple fitting that applies a vacuum to secure the optomechanical component to the tray.

In another form, the optomechanical component is placed in a pocket of the plurality of pockets of the tray by a vacuum tip tool of a fiber array bonder machine, and the fiber array bonder machine utilizes the at least one fiducial of each pocket to identify the pocket for placement of the optomechanical component.

In another form, wherein the tray has dimensions corresponding to a generic matrix tray for handling and shipping defined according to Joint Electron Device Engineering Council (JEDEC) Solid State Technology Association Publication Number 95 Design Guide 4.10. In another form, the tray is composed of a material having a static dissipative surface resistivity of between $10^5$ to $10^{12}$ ohms/square. In another form, the tray is composed of a carbon-filled glass composite.

In another form, the tray is configured to support an additional one or more trays while the optomechanical component is held by the tray, wherein the additional one or more trays are stacked upon the tray.

In one form, a method is provided comprising: positioning a vacuum tip tool of a bonding machine in contact with an optomechanical component assembly resting in a pocket of a tray, wherein the vacuum tip tool comprises a first vacuum tip and a second vacuum tip, wherein the optomechanical component assembly comprises a head portion that joins a first optical fiber and a second optical fiber at a first end of each optical fiber, a first optical connector attached to a second end of the first optical fiber, a second optical connector attached to a second end of the second optical fiber, and a clip having a body portion and a plurality of gripping elements that attach to the first optical connector and the second optical connector to join the first optical fiber and the second optical fiber, and wherein positioning the vacuum tip tool comprises placing the first vacuum tip in contact with the head portion and the second vacuum tip in contact with the body portion of the clip; activating the vacuum tip tool to apply negative pressure, via the first vacuum tip and the second vacuum tip, to the head portion and the body portion of the clip; and removing the optomechanical component assembly from the pocket of the tray by moving the vacuum tip tool of the bonding machine.

In another form, positioning the vacuum tip tool comprises: using a visioning system of the bonding machine to identify a first fiducial of the pocket and a second fiducial of the clip; and orienting the vacuum tip tool based on the first fiducial and the second fiducial.

In another form, the optomechanical component assembly is supported by the pocket prior to removing the optomechanical component assembly, and wherein the pocket comprises a first cradle element that supports the clip of the optomechanical component assembly and a second cradle element that supports the head portion of the optomechanical component assembly.

In one form, a clip for an optomechanical component that includes a pair of optical fibers is provided, the clip comprising: a body having a top face and a bottom face; and a plurality of gripping elements arranged in pairs on the bottom face, each pair of gripping elements configured to support a barrel of an optical connector of a pair of optical connectors each attached to a corresponding optical fiber of the pair of optical fibers.

In another form, the top face of the clip comprises a contact area for a vacuum tip, and a fiducial.

In another form, the body of the clip is configured to rest with the bottom face contacting a cradle element of a pocket of a tray.

In another form, the body of the clip includes a pair of notches on opposite sides of the body, wherein each notch is configured to mate with a stabilizing element. In another form, the body of the clip includes a plurality of body cutouts to permit flexing of the body of the clip during insertion of the barrel of the optical connector.

In another form, a gripping element of the plurality of gripping elements includes one or more grip cutouts configured to permit flexing of the gripping element. In another form, the plurality of gripping elements includes two pairs of gripping elements. In another form, a gripping element of the plurality of gripping elements includes one or more flat portions that contact the barrel of the optical connector when a force is applied to the barrel that accelerates the barrel toward the bottom face of the body of the clip. In another form, a gripping element of the plurality of gripping elements has an inset portion configured to mate with a flange of the barrel of an optical connector.

In another form, the two pairs of gripping elements are offset to accommodate a difference in lengths of the optical fibers of the pair of optical fibers.

In another form, the clip is formed of a thermoplastic material.

In one form, a method is provided comprising: constraining a pair of optical connectors of an optomechanical component using a clip, wherein the optomechanical component comprises a head portion that joins a pair of optical fibers, each optical fiber terminating in an optical connector of the pair of optical connectors, wherein the clip comprises a body having a top face and a bottom face, wherein the bottom face comprises a plurality of gripping elements arranged in pairs, each pair of gripping elements configured to support a barrel of an optical connector of a pair of optical connectors each attached to a corresponding optical fiber of the pair of optical fibers, and wherein constraining the pair of optical connectors comprises: holding the clip in place with a pair of stabilizing elements positioned on opposite sides of the body of the clip, wherein the pair of stabilizing elements together apply an inward force to place the body of the clip in compression, and wherein each stabilizing element of the pair of stabilizing elements mates with a notch of a corresponding pair of notches of the body of the clip; and positioning a block element at the bottom face of the clip so that the block element contacts each optical connector of the pair of optical connectors, and applies a force that constrains each optical connector against the corresponding pair of gripping elements.

In another form, the method further includes after constraining the pair of optical connectors, emitting light into an optical connector of the pair of optical connectors.

In another form of the method, the plurality of gripping elements comprises two pairs of gripping elements. In another form of the method, a gripping element of the plurality of gripping elements includes one or more flat portions that contact the barrel of the optical connector when the force is applied by the block element. In another form of the method, the force applied by the block element is applied in a direction that accelerates the pair of optical connectors toward the bottom face of the body of the clip.

In another form of the method, constraining the pair of optical connectors further comprises mating a flange of the barrel of an optical connector with an inset portion of a gripping element of the plurality of gripping elements.

In another form of the method, the top face of the clip comprises a fiducial, and the pair of stabilizing elements are positioned based on a position of the fiducial.

In one form, a method is provided comprising: inserting an optomechanical assembly onto a carrier, the optomechanical assembly comprising a head portion that joins a first optical fiber and a second optical fiber at a first end of each of the first optical fiber and the second optical fiber, a first optical connector attached to a second end of the first optical fiber, a second optical connector attached to a second end of the second optical fiber, and a clip having a body portion and a plurality of gripping elements that attach to the optical connectors of the first and second optical fibers to join the first and second optical fibers; inserting the carrier into a sliding module of a fixture; aligning the first optical connector with an examination element of the fixture by moving the sliding module; and examining the first optical fiber using the examination element.

In another form, the method further comprises moving the sliding module to align the second optical connector with the examination element; and examining the second optical fiber using the examination element.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
   a tray having a plurality of pockets arranged in an array, wherein each pocket is configured to hold an optomechanical component, and wherein each pocket includes:
   at least one fiducial hole;
   at least one vacuum hole;
   a first cradle element configured to support a clip that attaches to one or more optical fibers of the optomechanical component, wherein the clip rests on the first cradle element when the optomechanical component is held in the pocket; and
   a second cradle element configured to support a head of the optomechanical component.

2. The apparatus of claim 1, wherein the tray has dimensions corresponding to a generic matrix tray for handling and shipping defined according to Joint Electron Device Engineering Council (JEDEC) Solid State Technology Association Publication Number 95 Design Guide 4.10 and variations thereof.

3. The apparatus of claim 1, wherein the tray is composed of a carbon-filled glass composite.

4. The apparatus of claim 1, wherein the tray is composed of a material having a static dissipative surface resistivity of between $10^5$ to $10^{12}$ ohms/square.

5. The apparatus of claim 1, wherein the tray is configured to be stacked onto an additional one or more trays.

6. The apparatus of claim 1, wherein the tray is configured to support an additional one or more trays stacked upon the tray.

7. The apparatus of claim 1, wherein the plurality of pockets comprises thirty-six pockets arranged in a six-by-six array.

8. An apparatus comprising:
   an optomechanical component comprising a head portion that joins a first optical fiber and a second optical fiber at a first end of each optical fiber, a first optical connector attached to a second end of the first optical fiber, a second optical connector attached to a second end of the second optical fiber, and a clip having a body portion and a plurality of gripping elements that attach to the first optical connectors and the second optical connectors to join the first optical fiber and the second optical fiber; and
   a tray having a plurality of pockets arranged in an array, wherein each pocket of the tray includes:
   at least one fiducial,
   at least one vacuum hole,
   a first cradle element that supports the clip of the optomechanical component, wherein the clip rests on the first cradle element when the optomechanical component is held in the pocket,
   and a second cradle element that supports the head portion of the optomechanical component.

9. The apparatus of claim 8, wherein the first optical connector and/or the second optical connector comprises a Lucent Connector (LC) port.

10. The apparatus of claim 8, wherein the first optical fiber and the second optical fiber have different lengths.

11. The apparatus of claim 8, wherein the plurality of pockets comprises thirty-six pockets arranged in a six-by-six array.

12. The apparatus of claim 8, wherein the at least one vacuum hole is configured to mate with a vacuum nipple fitting that applies a vacuum to secure the optomechanical component to the tray.

13. The apparatus of claim 8, wherein the optomechanical component is placed in a pocket of the plurality of pockets of the tray by a vacuum tip tool of a fiber array bonder machine, and wherein the fiber array bonder machine utilizes the at least one fiducial of each pocket to identify the pocket for placement of the optomechanical component.

14. The apparatus of claim 8, wherein the tray has dimensions corresponding to a generic matrix tray for handling and shipping defined according to Joint Electron Device Engineering Council (JEDEC) Solid State Technology Association Publication Number 95 Design Guide 4.10 and variations thereof.

15. The apparatus of claim 8, wherein the tray is composed of a material having a static dissipative surface resistivity of between $10^5$ to $10^{12}$ ohms/square.

16. The apparatus of claim 8, wherein the tray is composed of a carbon-filled glass composite.

17. The apparatus of claim 8, wherein the tray is configured to support an additional one or more trays while the optomechanical component is held by the tray, wherein the additional one or more trays are stacked upon the tray.

18. A method comprising:
    positioning a vacuum tip tool of a bonding machine in contact with an optomechanical component assembly resting in a pocket of a tray, wherein the vacuum tip tool comprises a first vacuum tip and a second vacuum tip, wherein the optomechanical component assembly comprises a head portion that joins a first optical fiber and a second optical fiber at a first end of each optical fiber, a first optical connector attached to a second end of the first optical fiber, a second optical connector attached to a second end of the second optical fiber, and a clip having a body portion and a plurality of gripping elements that attach to the first optical connector and the second optical connector to join the first optical fiber and the second optical fiber, and wherein positioning the vacuum tip tool comprises placing the first vacuum tip in contact with the head portion and the second vacuum tip in contact with the body portion of the clip;

activating the vacuum tip tool to apply negative pressure, via the first vacuum tip and the second vacuum tip, to the head portion and the body portion of the clip; and removing the optomechanical component assembly from the pocket of the tray by moving the vacuum tip tool of the bonding machine.

19. The method of claim 18, wherein positioning the vacuum tip tool comprises:

using a visioning system of the bonding machine to identify a first fiducial of the pocket and a second fiducial of the clip; and orienting the vacuum tip tool based on the first fiducial and the second fiducial.

20. The method of claim 18, wherein the optomechanical component assembly is supported by the pocket prior to removing the optomechanical component assembly, and wherein the pocket comprises a first cradle element that supports the clip of the optomechanical component assembly and a second cradle element that supports the head portion of the optomechanical component assembly.

\* \* \* \* \*